(12) United States Patent
Stephens, Jr.

(10) Patent No.: US 9,218,854 B2
(45) Date of Patent: *Dec. 22, 2015

(54) STACK POSITION DETERMINATION IN MEMORY DEVICES CONFIGURED FOR STACKED ARRANGEMENTS

(71) Applicant: III HOLDINGS 2, LLC, Wilmington, DE (US)

(72) Inventor: Michael C. Stephens, Jr., Los Gatos, CA (US)

(73) Assignee: III Holdings 2, LLC, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 14/540,196

(22) Filed: Nov. 13, 2014

(65) Prior Publication Data

US 2015/0138897 A1 May 21, 2015

Related U.S. Application Data

(63) Continuation of application No. 13/365,413, filed on Feb. 3, 2012, now Pat. No. 8,891,278.

(60) Provisional application No. 61/570,215, filed on Dec. 13, 2011.

(51) Int. Cl.
*G11C 7/10* (2006.01)
*G11C 5/02* (2006.01)
(Continued)

(52) U.S. Cl.
CPC .. *G11C 5/02* (2013.01); *G11C 5/04* (2013.01); *G11C 5/06* (2013.01); *G11C 5/063* (2013.01); *G11C 5/14* (2013.01); *G11C 7/10* (2013.01); *G11C 7/106* (2013.01); *G11C 7/22* (2013.01); *G11C 11/401* (2013.01);
(Continued)

(58) Field of Classification Search
CPC .............. G11C 7/10; G11C 5/02; G11C 5/04; G11C 5/06; G11C 11/401; G11C 11/40622
USPC ....................... 365/63, 51, 201; 257/686, 777
See application file for complete search history.

(56) References Cited

U.S. PATENT DOCUMENTS

| 5,719,445 A | 2/1998 | McClure |
| 6,233,157 B1 | 5/2001 | Yoon et al. |

(Continued)

OTHER PUBLICATIONS

Final Office Action on U.S. Appl. No. 14/010,864, mailed Nov. 6, 2014.
(Continued)

*Primary Examiner* — Douglas King

(57) ABSTRACT

Disclosed are various embodiments related to stacked memory devices, such as DRAMs, SRAMs, EEPROMs, and CAMs. For example, stack position identifiers (SPIDs) are assigned or otherwise determined, and are used by each memory device to make a number of adjustments. In one embodiment, a self-refresh rate of a DRAM is adjusted based on the SPID of that device. In another embodiment, a latency of a DRAM or SRAM is adjusted based on the SPID. In another embodiment, internal regulation signals are shared with other devices via TSVs. In another embodiment, adjustments to internally regulated signals are made based on the SPID of a particular device. In another embodiment, serially connected signals can be controlled based on a chip SPID (e.g., an even or odd stack position), and whether the signal is an upstream or a downstream type of signal.

24 Claims, 26 Drawing Sheets

(51) Int. Cl.

| | | |
|---|---|---|
| *G11C 11/406* | (2006.01) | |
| *G11C 5/06* | (2006.01) | |
| *G11C 5/04* | (2006.01) | |
| *G11C 29/02* | (2006.01) | |
| *G11C 29/50* | (2006.01) | |
| *G11C 5/14* | (2006.01) | |
| *G11C 16/30* | (2006.01) | |
| *G11C 11/401* | (2006.01) | |
| *G11C 29/44* | (2006.01) | |
| *G11C 7/22* | (2006.01) | |

(52) U.S. Cl.
CPC ... *G11C 11/40615* (2013.01); *G11C 11/40622* (2013.01); *G11C 16/30* (2013.01); *G11C 29/023* (2013.01); *G11C 29/028* (2013.01); *G11C 29/50016* (2013.01); *G11C 5/147* (2013.01); *G11C 7/222* (2013.01); *G11C 11/406* (2013.01); *G11C 2029/4402* (2013.01); *G11C 2211/4061* (2013.01); *G11C 2211/4067* (2013.01); *G11C 2213/71* (2013.01)

(56) References Cited

U.S. PATENT DOCUMENTS

| | | | |
|---|---|---|---|
| 6,480,931 | B1 | 11/2002 | Buti et al. |
| 7,446,420 | B1 | 11/2008 | Kim |
| 7,480,166 | B2 | 1/2009 | Jeung et al. |
| 7,791,918 | B2 | 9/2010 | Ruby |
| 7,791,919 | B2 | 9/2010 | Shimizu |
| 7,822,910 | B2 | 10/2010 | Kao |
| 7,834,440 | B2 | 11/2010 | Ito et al. |
| 7,916,511 | B2 | 3/2011 | Park |
| 7,930,492 | B2 | 4/2011 | Chung et al. |
| 8,054,597 | B2 | 11/2011 | Gebreselasie et al. |
| 8,270,228 | B2 | 9/2012 | Mizukane et al. |
| 8,378,500 | B2 | 2/2013 | Choi |
| 8,397,013 | B1 | 3/2013 | Rosenband et al. |
| 8,405,221 | B2 | 3/2013 | Imai |
| 8,437,163 | B2 | 5/2013 | Nakanishi et al. |
| 8,492,905 | B2 | 7/2013 | Suh |
| 8,599,595 | B1 | 12/2013 | Stephens, Jr. |
| 8,659,928 | B1 | 2/2014 | Stephens, Jr. |
| 8,891,278 | B1 * | 11/2014 | Stephens, Jr. .................. 365/63 |
| 2002/0052633 | A1 | 5/2002 | Prutchi et al. |
| 2006/0052961 | A1 | 3/2006 | Best |
| 2008/0283995 | A1 | 11/2008 | Bucki et al. |
| 2009/0097393 | A1 | 4/2009 | Diab et al. |
| 2009/0268539 | A1 | 10/2009 | Ruckerbauer et al. |
| 2010/0034005 | A1 | 2/2010 | Lee |
| 2011/0044084 | A1 | 2/2011 | Chung et al. |
| 2011/0194326 | A1 | 8/2011 | Nakanishi et al. |
| 2012/0122251 | A1 | 5/2012 | Yamada et al. |
| 2012/0249219 | A1 | 10/2012 | Shoemaker |

OTHER PUBLICATIONS

Non-Final Office Action on U.S. Appl. No. 14/021,534, mailed Dec. 4, 2013.
Non-Final Office Action on U.S. Appl. No. 13/403,122, mailed Jun. 14, 2013.
Non-Final Office Action on U.S. Appl. No. 13/491,090, mailed Nov. 21, 2013.
Non-Final Office Action on U.S. Appl. No. 13/534,279, mailed Jan. 21, 2015.
Non-Final Office Action on U.S. Appl. No. 13/964,764, mailed May 23, 2014.
Non-Final Office Action on U.S. Appl. No. 14/010,864, mailed Jun. 20, 2014.
Non-Final Office Action on U.S. Appl. No. 14/071,443, mailed Jan. 22, 2014.
Notice of Allowance on U.S. Appl. No. 13/466,736, mailed Oct. 28, 2013.
Notice of Allowance on U.S. Appl. No. 13/349,833, mailed Oct. 18, 2013.
Notice of Allowance on U.S. Appl. No. 13/357,384, mailed Jul. 17, 2013.
Notice of Allowance on U.S. Appl. No. 13/425,636, mailed Sep. 3, 2013.
Notice of Allowance on U.S. Appl. No. 13/455,893, mailed Feb. 24, 2014.
Notice of Allowance on U.S. Appl. No. 13/491,090, mailed Dec. 6, 2013.
Notice of Allowance on U.S. Appl. No. 13/534,402, mailed Jun. 9, 2014.
Notice of Allowance on U.S. Appl. No. 13/964,764, mailed Oct. 24, 2014.
Notice of Allowance on U.S. Appl. No. 14/021,534, mailed Jan. 17, 2014.
Notice of Allowance on U.S. Appl. No. 13/403,122, mailed Aug. 23, 2013.
Notice of Allowance on U.S. Appl. No. 14/071,443, mailed Apr. 2, 2014.
Notice of Allowance on U.S. Appl. No. 13/365,413, mailed Jul. 29, 2014.
Non-Final Office Action on U.S. Appl. No. 14/060,276, mailed Mar. 4, 2015.
Non-Final Office Action on U.S. Appl. No. 14/105,547, mailed Feb. 20, 2015.
Notice of Allowance on U.S. Appl. No. 14/010,864, mailed Feb. 17, 2015.
Notice of Allowance on U.S. Appl. No. 13/534,279 mailed Jun. 4, 2015.
Notice of Allowance on U.S. Appl. No. 14/105,457, mailed Jun. 10, 2015.
Notice of Allowance on U.S. Appl. No. 14/060,276, mailed Jul. 15, 2015.

* cited by examiner

STACK POSITION DETERMINATION IN MEMORY DEVICES CONFIGURED FOR STACKED ARRANGEMENTS

CROSS-REFERENCE TO RELATED PATENT APPLICATIONS

This application is a Continuation of U.S. application Ser. No. 13/365,413, filed Feb. 3, 2012, which claims priority from U.S. Provisional Application 61/570,215, filed Dec. 13, 2011, both of which are incorporated herein by reference in its entirety.

FIELD

The present invention generally relates to the field of semiconductor memory devices, and more particularly, to semiconductor memory devices configured for stacked arrangements.

BACKGROUND

In many multichip arrangements, devices (e.g., integrated circuits, dice, or chips) may be placed in side to side configurations. Examples of these types of arrangements include single in-line memory module (SIMM) and dual in-line memory module (DIMM) configurations. Other multichip arrangements include multichip module (MCM) structures of chips that may share a common package. However, such conventional multichip approaches may not be suitable for relatively large 1/0 and density structures. For these applications, vertical stacking using through-silicon vias (TSVs) and die-to-die vias represents a more promising technology. However, these technologies may be limited by various drawbacks and challenges related to on-chip circuitry for the stacked devices.

DETAILED DESCRIPTION OF EMBODIMENTS

Figure 1:
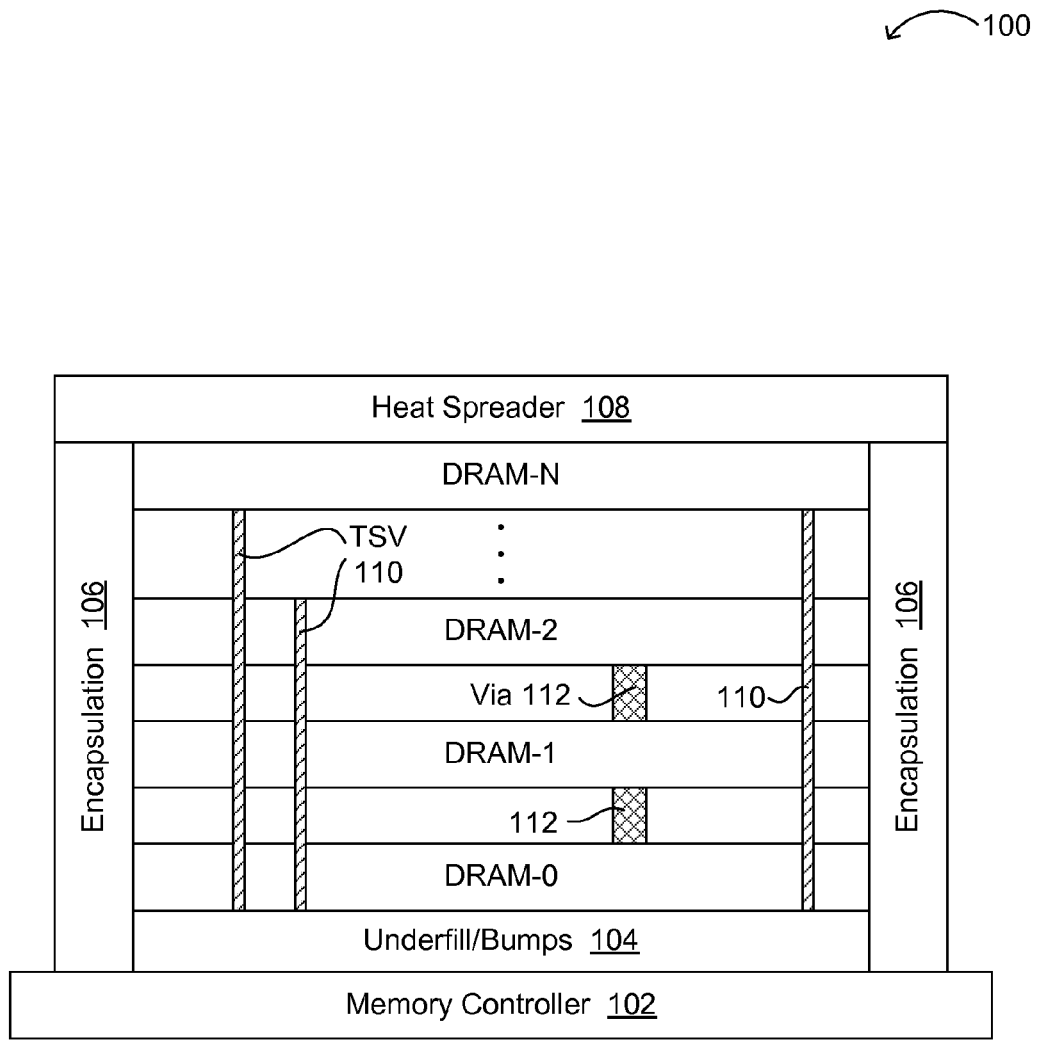
FIG. 1 is a cross-section diagram showing an example stacked memory device structure.

Reference will now be made in detail to particular embodiments of the invention, examples of which are illustrated in the accompanying drawings. While the invention will be described in conjunction with particular embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, etc. have not been described in detail so as not to unnecessarily obscure aspects of the present invention.

Some portions of the detailed descriptions which follow are presented in terms of processes, procedures, block arrangements, logic blocks, functional blocks, processing, and/or other symbolic representations of operations or device arrangements. These descriptions and representations are generally used by those skilled in the relevant arts to effectively convey the substance of their work to others skilled in the art.

Particular embodiments can advantageously provide circuits, methods, and structures, to facilitate circuit operation for stacked memory devices. For example, particular embodiments can advantageously provide approaches that allow for devices to be manufactured using a same mask set and layout patterns regardless of a device's ultimate position in a stack of memory devices.

Various embodiments relate to stacked memory devices, such as dynamic random access memories (DRAMs), static RAMs (SRAMs), electrically erasable programmable read-only memories (EEPROMs), field-programmable gate arrays (FPGAs), and content addressable memories (CAMs). For example, identifiers that indicate a stack position of a device may be assigned or otherwise determined, and used by each memory device to make a number of adjustments on that device. In one embodiment, a self-refresh rate of a DRAM can be adjusted based on the SPID of that device. In another embodiment, a latency of a memory device can be adjusted based on the SPID. In another embodiment, internal regulation signals may be connected with other devices by way of through-silicon vias (TSVs) and control circuitry, such as when operating in a test mode. In another embodiment, adjustments to internally regulated signals can be made based on the SPID of a particular device. In another embodiment, serially connected signals can be controlled based on a chip SPID (e.g., an even or odd stack position), and whether the signal is an upstream or a downstream type of signal. These and various other embodiments will be discussed in more detail below.

Referring now to FIG. 1, shown is a cross-section diagram 100 of an example stacked memory device or "3-D" structure. In this example, memory controller 102 can support a number of DRAM devices (e.g., DRAM-0, DRAM-1, DRAM-2, . . . DRAM-N) arranged in a stacked configuration. Memory controller 102 may represent any processing or logical computing device, as well as any common interface for the memory devices stacked thereon. Underfill/bumps 104 can include C4 bumps and underfill for connection to the DRAMs. Encapsulation 106 may encapsulate the stacked DRAMs, and the structure may be capped by heat spreader 108. For example, heat spreader 108 can be an integrated heat spreader (IHS).

Interconnections between one or more of the DRAMs and memory controller 102 can be accommodated by use of through-silicon vias (TSVs) 110 and/or die-to-die vias 112. TSVs 110 may also include thermal TSVs (TTSVs) for use in managing heat dissipation, and reducing temperature differences, within structure 100. In addition, interlayer dielectric (ILD) and signal layers may also be included in the regions between the DRAMs. However, pad arrangements and associated control circuitry on each chip in particular embodiments can allow for simplified signal layer routing, or in some cases the complete removal of such a signal layer.

While memory controller 102 is shown, any suitable interface chip or device is contemplated in certain embodiments. Any type of memory interface chip, processor, type of controller, switch fabric, other memory chip, optical processing layer, or package substrate, can be utilized in place of memory controller 102 in some applications. Further, while pads described herein may include metal pads or other connections to TSVs, particular embodiments may also not include actual metal pads, but rather other types of connections to TSVs. For example, pads can include connections below a surface of a semiconductor device, such as when a connection layer (e.g., layers of metallization for signal connections) is used between a TSV and the semiconductor device surface. However, metal pads on a semiconductor surface may be desirable so that the probe testing as part of a test flow (e.g., including final test, etc.) can be performed to determine known good die (KGD) prior to placing the die in a stack to form a stack the memory devices. In any event, "pads" as described herein can represent any interconnect position on a semiconductor device. As will be discussed in more detail below, testing may also be performed once the memory devices are secured in a stack.

TSVs can be formed using any suitable fabrication process. For example, a frontend-of-line (FEOL) process that creates active devices can proceed or follow TSV formation. In this case, wafer thinning to expose the TSVs on a wafer backside can occur with a back-end-ofline (BEOL) process that creates conductive lines for power and signals between devices and offchip connections. In another example, TSV formation can occur from the wafer backside after device wafer fabrication and thinning TSVs and/or die-to-die vias can be filled with any suitable conductive material (e.g., doped polysilicon, tungsten, copper, etc.). In any event, particular embodiments are suitable for stacked memory devices utilizing TSV, die-to-die via, as well as other chip interconnections.

TSV processing steps can include via etch or drill, an insulator and seed layer deposition, and via fill. The via etch step can include a deep reactive ion etching (DRIE) process, or a laser etching process using ultraviolet lasers. The insulating layer may include Si02, and may be deposited using chemical vapor deposition (CVD) techniques. Organic layers (e.g., parylene) may also be utilized as an insulating layer in some embodiments. Also, a diffusion barrier layer (e.g., TiN) may follow deposition of the insulating layer. A seed layer (e.g., TiN and Cu) may then be deposited (e.g., via CVD techniques) to facilitate metallization in the TSV. The TSV may then be filled, such as by depositing tungsten using a CVD process, or electrochemical plating for copper metallization. Of course, other methods and materials as to TSV, die-to-die via, and/or other chip interconnections can also be employed in particular embodiments.

In addition, while TSVs and die-to-die vias are discussed in various examples herein, other types of connections suitable for interconnections among stacked devices can also be employed in particular embodiments. For example, one or more signal layers, interposers, or other substrates can be utilized between memory devices in the stack. Also, TSVs may be mated to microbumps that may then be connected to other TSVs and/or a signal layer or substrate. Thus, particular embodiments are suitable to a variety of types of interconnections between chips that are stacked on top of one another.

Particular embodiments are suited to chips or devices that may not utilize different mask patterns based on an ultimate position in a stack of memory devices. In this way, highvolume manufacturing of individual memory devices can occur without regard to possible applications for the memory devices that might include stacked arrangements. This is accomplished by design techniques that allow each memory device to adapt dynamically to any position in the stack of memory devices.

Figure 2:
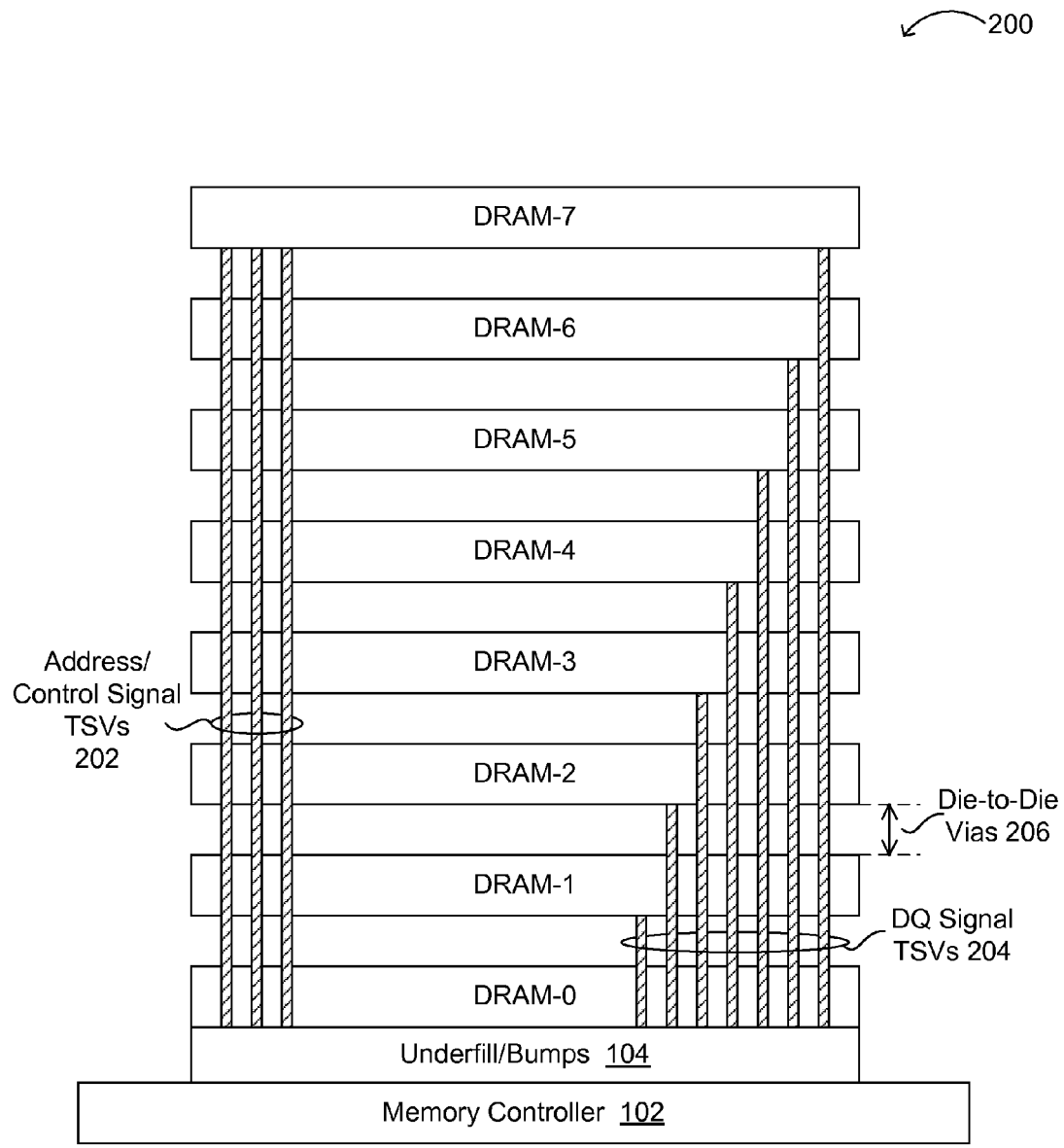
FIG. 2 is a cross-section diagram showing an example DRAM stack structure with a memory controller.

Referring now to FIG. 2, shown is a cross-section diagram 200 of an example DRAM stack structure with a memory controller. In this example, eight DRAM memory devices (e.g., DRAM-0, DRAM-1, . . . DRAM-7) are stacked on top of underfill/bumps 104 and memory controller 102. Address and control signal TSVs 202, which may also include die-to-die vias 206, may be used for signals carried from memory controller 102 to each DRAM. DQ signal TSVs 204, which may also include die-to-die vias 206, can be used to form a given connection to a corresponding DRAM device. This particular structure can be used in a wide I/O applications whereby the I/Os supplied by each individual DRAM are connected in parallel fashion. For example, if each DRAM is configured in a 16-bit I/O configuration, parallelizing these I/Os across eight chips may provide a module with a 128-bit I/O configuration. Similarly, if each DRAM is configured in a 64-bit configuration, the module can be configured as a 512-bit configuration. Of course, any number of memory devices (e.g., 2, 4, 8, 16, etc.) in the stack, and any DQ configurations (e.g., 4, 8, 16, 32, 64, 128, 256, -bits, etc.), can be accommodated in particular embodiments.

The particular example of FIG. 2 actually shows a corresponding DQ signal for each memory device. Also, each memory device may be manufactured with the same mask set or set of layout patterns. Thus in this example, a single on-chip DQ or data path may be mapped to eight different positions (e.g., possible pad connections) on that chip in order to accommodate any positioning within the memory device stack. One alternative way to accomplish this is to design a separate BEOL or metal layer/pad structure for each memory device based on its ultimate position in the memory stack. However, it may not be desirable to maintain eight separate memory device manufacturing and/or test lines. This problem only gets worse as chip stacking and interconnect technology improves to allow a higher number of devices to be stacked. As such, a single device manufacturing/test flow whereby each memory device is adaptable to any position in the DRAM stack is desirable. Particular embodiments provide on-chip controls in order to drive different DQ pad positions without necessarily having to distinguish the devices during semiconductor processing, sort, or test based on a stack position. In this way, the manufacture of each DRAM device can be performed by using a same mask set and layout patterns, and traditional per-singlechip test methodologies.

In particular embodiments, multiple pads (e.g., different pads or external interconnect positions) that are allocated to a same signal can be configured on a memory device based on a stack position. In one embodiment, a semiconductor memory device can include: (i) a plurality of pads allocated to a signal on the semiconductor memory device; (ii) a stack position identifier for identifying a position of the semiconductor memory device in an aligned vertical stack of a plurality of semiconductor memory devices; and (iii) a pad selector configured to select one of the plurality of pads to be connected to the signal on the semiconductor memory device in response to the stack position identifier, where the pad selector is configured to disconnect each of a remaining of the plurality of pads from the signal based on the stack position identifier.

Figure 3:
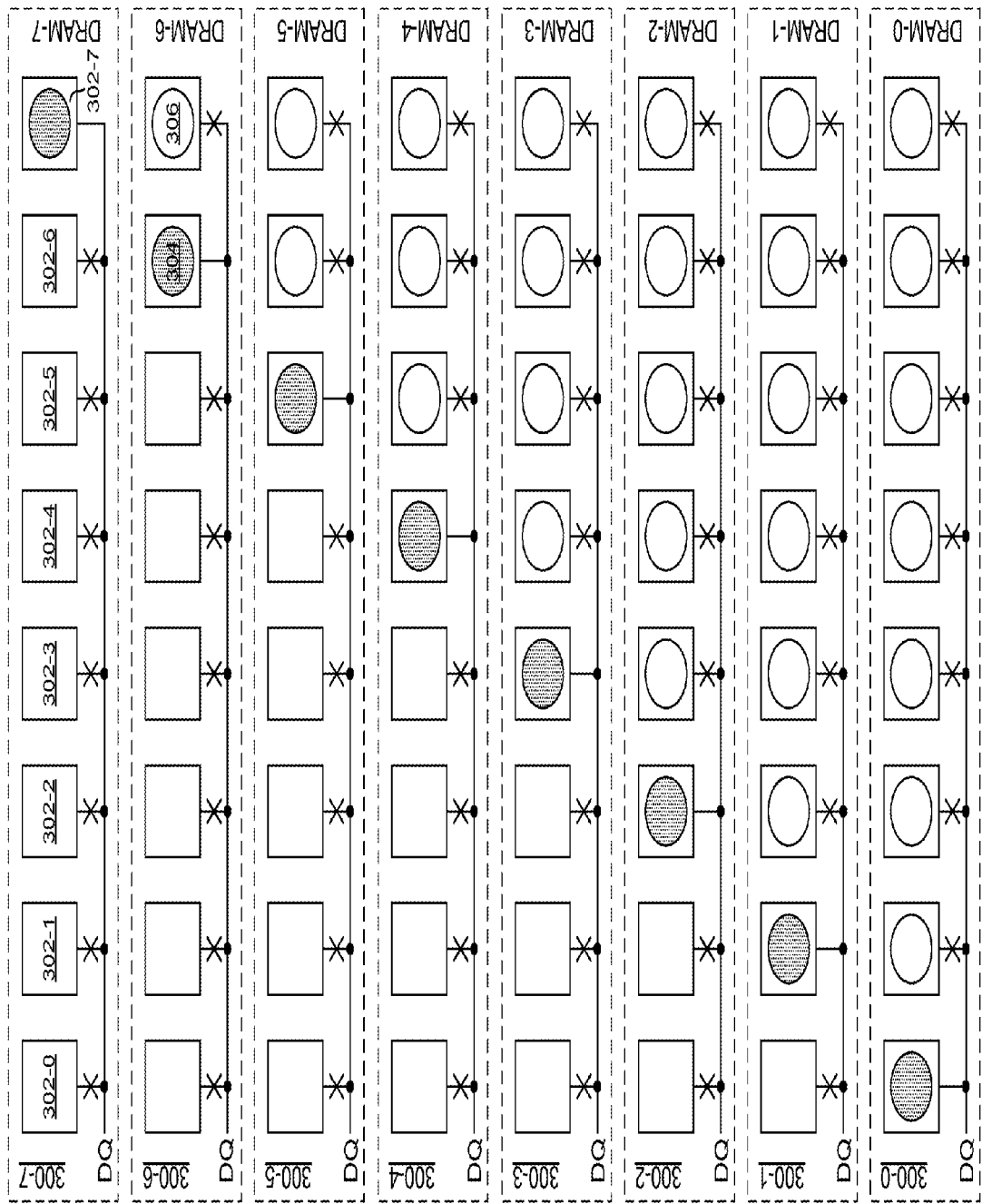
FIG. 3 is a diagram showing an example DQ pad mapping for DRAMs in a stacked arrangement.

Referring now to FIG. 3, shown is a diagram of an example DQ pad mapping for DRAMs in a stacked arrangement. Each mapping 300 shows an example pad (e.g., a metal pad) or connection position mapping for a given DRAM in the stack. These mappings represent examples of mappings for a given pad or other type of connection interface suitable for connecting with other devices. For example, each of pads 302 can be configured to connect to another device by way of one or more die-to-die vias and/or one or more TSVs, and the connections may be direct or through other circuitry. In particular embodiments, such a mapping of different pads or interconnection positions on a memory device can be controlled on-chip based on a stack position of that chip. This may be in addition to external connectivity based on die-to die vias, signal layers, and/or TSVs.

When viewed in conjunction with FIG. 2, FIG. 3 shows one example mapping for a DQ signal, whereby an enabled pad or interconnect position is controlled based on a position of the DRAM in the stack. For example, as shown in 300-0, DRAM-0 has only a leftmost pad enabled for the DQ signal (indicated by a shaded circle on the leftmost pad [see also, e.g., 304]), while each of the remaining seven pads in the mapping are isolated from the DQ signal (isolations are indicated by "X" on the signal lines). A circle in the square pad (see, e.g., 306) can indicate a die-to-die via and/or TSV connection thereto. Thus, because DRAM-0 is at the bottom of the stack of eight DRAMs, each pad or interconnection position map to the DQ signal may be connected to a die-to-die via and/or a TSV. However, particular embodiments allow for control such that only one of the eight pads (e.g., a leftmost or first pad for the DRAM-0 in the mapping are enabled for that DRAM. As a result, excess capacitance due to the inter-chip connections on alternative pad positions can be substantially cut-off.

Similarly, as shown in 300-1, a next in stack DRAM-I can have a next in line pad (e.g., second pad from the left) enabled, while others in the mapping are disabled. Note also that the leftmost pad in DRAM-I may not have a die-to-die via or connection to the TSV, while other pads in the mapping do. Note also that the DQ signal described here may represent an internal data input and/or output signal, and may be a signal that would otherwise connect to the pad absent electrostatic discharge (ESD) and/or driver or other input path and/or output path control circuitry. As such, the DQ signal may represent any signal internal to the chip that may be mapped to one of eight (or any number of) pads or interconnect positions on a given memory device. As described herein, this arrangement represents one example of mapping an internal signal for connection on different external paths as a result of a stack position of the device.

As shown in 300-2, DRAM-2 may have a next in line pad enabled connection, and so on up the stack for DRAM-3 as shown in 300-3, DRAM-4 as shown in 300-4, DRAM-5 as shown in 300-5, DRAM-6 as shown in 300-6, and DRAM-7 as shown in 300-7. As shown in 300-7, each of eight pads or external connection positions 302-0, 302-1, ... 302-7 can be mapped to a single DQ signal. In the case of DRAM-7, a rightmost pad connection may be enabled for a path between DRAM-7 and memory controller 102. As shown in 300-7, each of the remaining possible pad connections in the leftmost seven positions can be disabled as a result of control based on the stack position. In this way, each DRAM or other memory device in the stack of devices can be customized to external (i.e., inter-chip) connections by enabling different possible interconnect positions in a mapping to a common signal (e.g., a DQ signal) based on stack position.

Of course, while eight DRAMs and eight DQ pad mappings are shown in this particular example, any number of memory devices and mappings to a common on-chip signal can be accommodated in particular embodiments. In addition, the memory devices in the stack of memory devices can be oriented either right side up or upside down. Further, references to "top," "bottom," "up," "down," "upstream," "downstream," "on top of," "above," "below," "vertical," "adjacent," etc., are made with reference to other devices in a stack of devices, and do not limit the invention to a particular orientation of the entire stack of devices, but are rather directed to relative positioning of the devices in a stack of memory devices, as well as any associated substrates, controllers, and the like.

Figure 4:
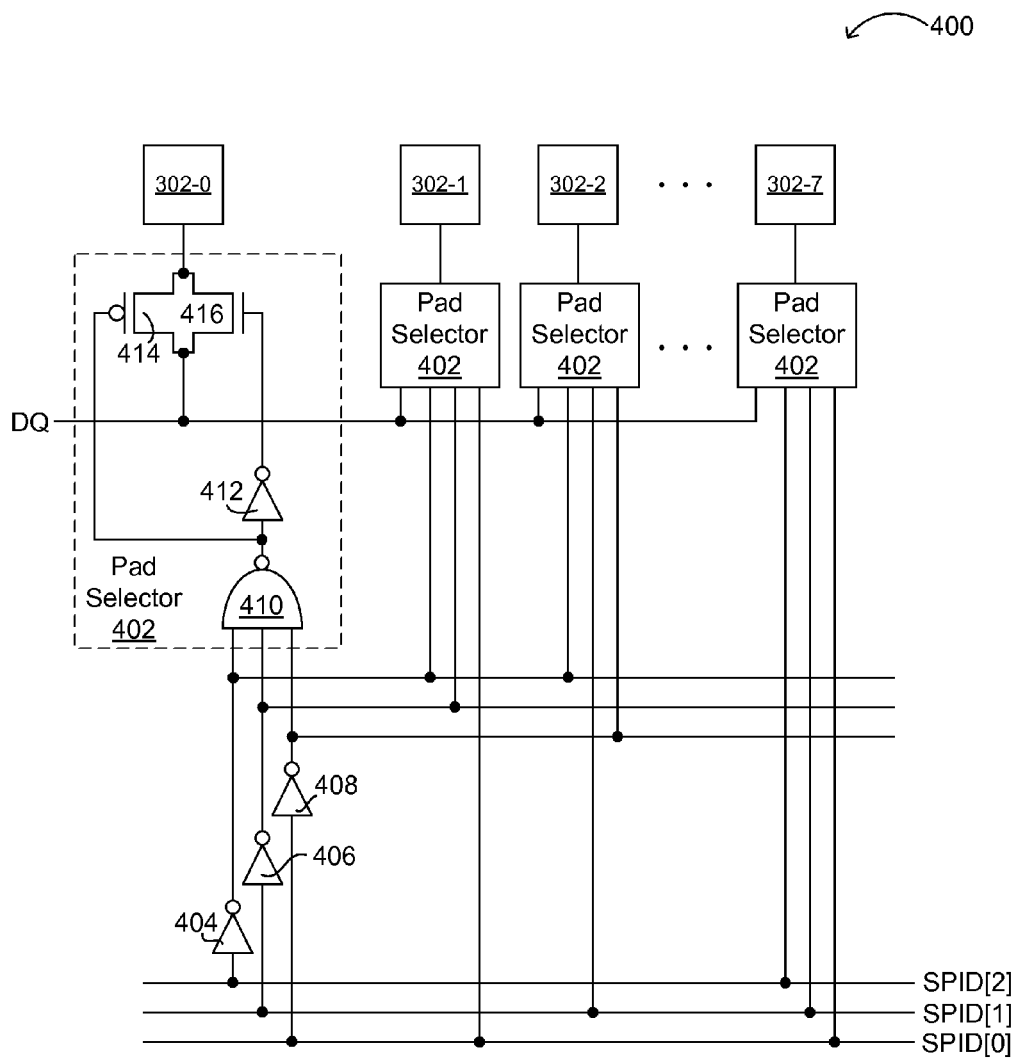
FIG. 4 is a block schematic diagram showing an example pad selector based on a stack position identifier (SPID).

Referring now to FIG. 4, shown is a block schematic diagram 400 of an example pad selector based on a stack position identifier (SPID). As will be discussed in more detail below, SPIDs can be programmed, assigned, or otherwise determined (e.g., automatically) for each memory device in a stack of such devices. In the example followed herein for eight DRAM devices, three SPID bits can be used to uniquely identify each DRAM in the stack based on its position in the stack. A wide variety of storage options can be used for storing the SPID values. For example, nonvolatile memory can be used, SRAM bits, or other latches, etc., can be used in certain embodiments. In one example, the SPID bits can be fuse-programmable, such as prior to or around the time of a stacking of such devices. In another example, the SPID bits can be metal programmable, but this would require different metal layout patterns for each stack position. As will be discussed in more detail below, certain embodiments also contemplate an automatic SPID detection or assignment after the memory devices are placed in a stack. In any event, an example correlation of SPID bits per memory device stack position is shown below in Table 1.

TABLE 1

| Memory Device Position | SPID[2] | SPID[1] | SPID[0] |
| --- | --- | --- | --- |
| DRAM-0 | 0 | 0 | 0 |
| DRAM-1 | 0 | 0 | 1 |
| DRAM-2 | 0 | 1 | 0 |
| DRAM-3 | 0 | 1 | 1 |
| DRAM-4 | 1 | 0 | 0 |
| DRAM-5 | 1 | 0 | 1 |
| DRAM-6 | 1 | 1 | 0 |
| DRAM-7 | 1 | 1 | 1 |

Based on the SPID (e.g., bit values as shown in Table 1), pad selectors can be used to isolate various pads or interconnect positions from the DQ signal. This selection may effectively remove excess capacitance due to the inter-chip connections on alternative pad positions (e.g., pad positions 302-0, 302-1, ... 302-6 in 300-7 of FIG. 3). A "pad" as described herein may represent an actual metal pad (e.g., a pad that can be probed), or any position configured for an interconnect to another chip. As discussed above, any signal mapping to a plurality of pads, or to different interconnect positions, based on a stack position, and in particular a stack position identifier, can be accommodated in particular embodiments. In the particular example of FIG. 4, pad selector 402 can be coupled to each pad or interconnect position 302. As shown for pad 302-0, associated pad selector 402 can include a pass gate formed by PMOS transistor 414 and NMOS transistor 416. NAND gate 410 can receive inverted SPID bit signals by way of inverter 404 for SPID[2], inverter 406 for SPID[1], and inverter 408 for SPID[0]. An output from NAND gate 410 can control transistor 414, while an inverted output via inverter 412 can control transistor 416.

In this example, pad position 302-0 may be disabled for this DQ signal unless SPID=000, representing the lowest memory device in the stack (see, e.g., 300-0 in FIG. 3). The pad selectors 402 can thus be programmed for each pad position 302 in order to control enabling and disabling of each such pad position 302 that is mapped to a corresponding DQ signal. For example, this DQ signal pad arrangement may be replicated for each data I/O for a particular memory device (e.g., 16 times for a 16-bit I/O DRAM). Depending on the stack position (e.g., via SPID) of a given DRAM in a stack of memory devices, only one of such pad positions 302 may be selected by pad selector 302 for each such DQ signal on a memory device.

In addition, pad selection circuitry may be replicated for different signals. For example, such pad selection circuitry may be shared among different DQ signals on a same memory device. This is because a given selection (e.g., 1 of 8) of pad positions may be the same for each such signal (e.g., DQ0, DQ1, DQ2, ... DQ15). Alternatively, pad selection circuitry 400 may be replicated for each mapping of common signals and pads. Further, pad selection circuitry 400 may also be used to steer a redundant pad path to replace that of a de-allocated memory device, such as where a top memory device in the stack may replace a de-allocated memory device in the stack. Also, as one skilled in the art will recognize, other digital logic or circuitry can be employed in order to achieve a similar type of decoding. In addition, various ESD considerations may also be accounted for in the design of pad selection circuitry in particular embodiments.

Figure 5:
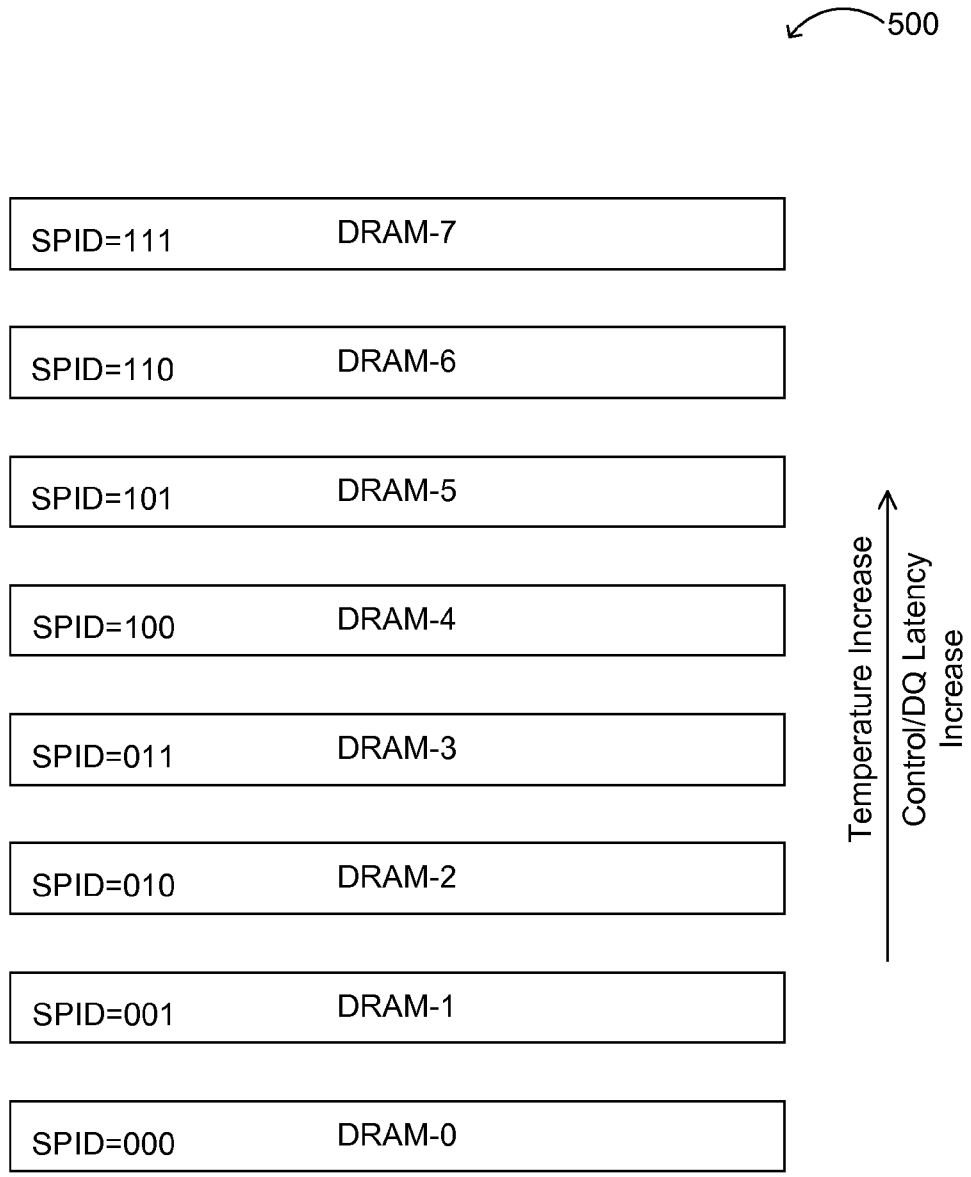
FIG. 5 is a cross-section diagram showing an example DRAM stack with temperature and latency relationships.

Referring now to FIG. 5, shown is a cross-section diagram 500 of an example DRAM stack with temperature and latency relationships. As indicated in this example stack of DRAM devices, as one goes up the stack, generally an increase in temperature may occur. As discussed above with respect to FIG. 1, temperature may be managed by use of a heat spreader 108, as well as by use of various thermal TSVs (TTSVs). These may help in equalizing temperature differences across memory devices in the stack, but may also result in increased die sizes and/or increased temperature differences across a same chip. In addition, various adjustments to internal circuitry based on SPID can be made in certain embodiments in order to accommodate such an anticipated temperature increase. Other effects associated with stacked memory devices include increased latency as one goes up the stack. This latency can be seen on various control and/or data signals. As will be discussed in more detail below, various latency adjustments can be made based on SPID in certain embodiments in order to effectively even out latency differences as seen at a memory interface chip (e.g., controller 102) or substrate.

Figure 6:
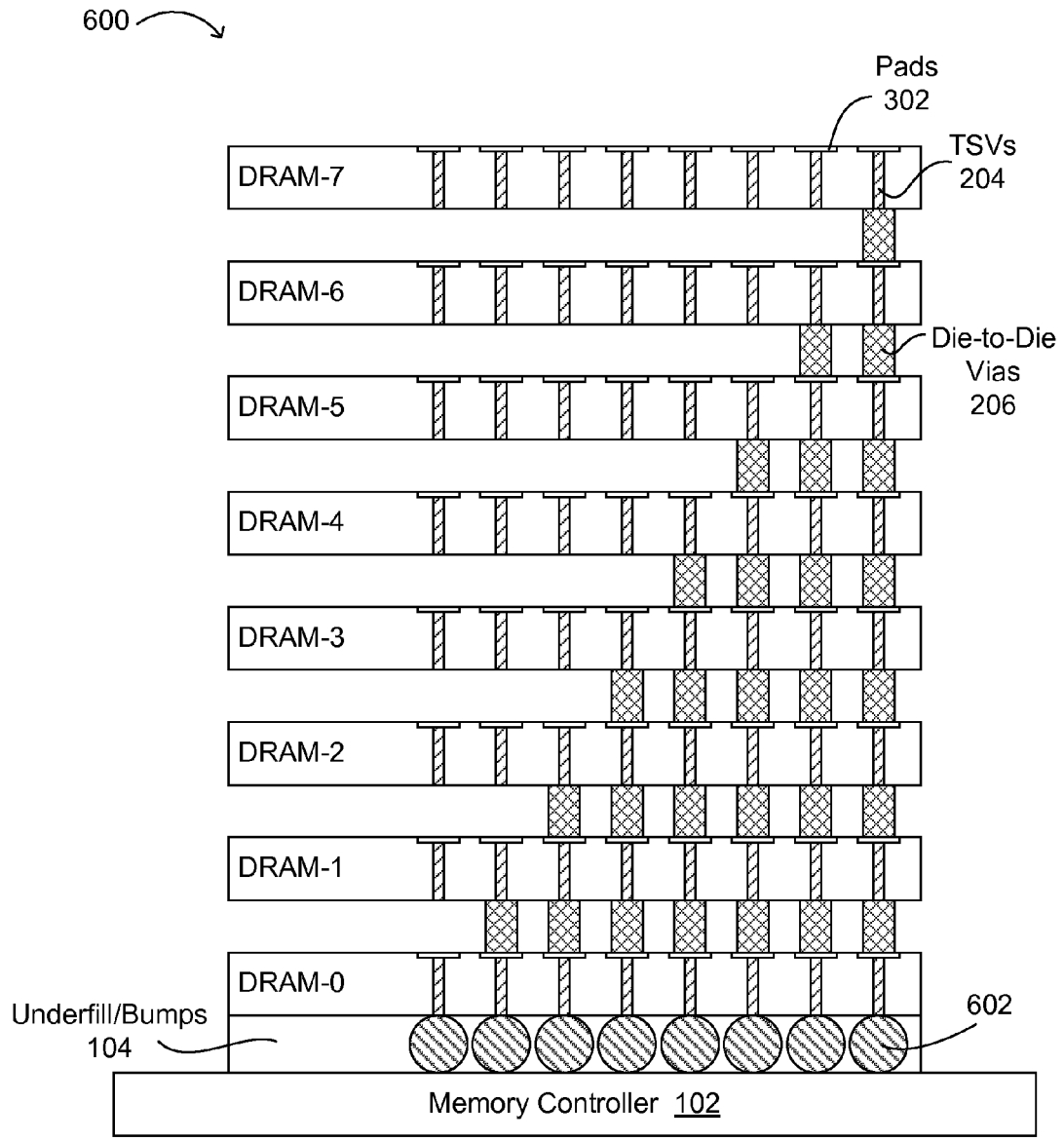
FIG. 6 is a cross-section diagram showing an example pad, through-silicon via (TSV) and die-to-die via structure for multiple pads.

Referring now to FIG. 6, shown is a cross-section diagram 600 of an example pad, TSV, and die-to-die via structure for multiple pads. This shows one example of possible connections between pads 302 at different positions on each device, with connections through other devices to memory controller 102. Of course, other circuitry or other connections or paths/arrangements may be included relative to TSVs 204, die-to-die vias 206, and underfill/bumps 104 (e.g., including balls or C4 bumps 602). Also, different relative dimensions, number of devices, ordering of pads, and common signals that map to a plurality of pads, are contemplated in particular embodiments. In any event, the example of FIG. 6 shows that a DRAM at a higher position (e.g., DRAM-7) in the stack may have a longer path to memory controller 102 as compared to a DRAM at a lower position (e.g., DRAM-1) in the stack.

In particular embodiments, stack position identifiers can be automatically determined based on a sensing of the connections on pads that are mapped to a common signal. In one embodiment, a method of determining a stack position of a semiconductor memory device, can include: (i) comparing, for each of a plurality of pads allocated to a same signal on the semiconductor memory device, a first capacitance on a first pad against a second capacitance on a second pad; (ii) setting a latch if the second capacitance is greater than the first capacitance by at least a predetermined amount; (iii) counting a number of the latches that remain reset to determine a stack position identifier for the semiconductor memory device; and (iv) storing the stack position identifier in a register on the semiconductor memory device.

In this way, stack position identifiers can automatically be determined by each memory device in the stack of memory devices based on comparing capacitances between associated pads. This allows for determination of stack positions by using circuitry found on each memory device, without having to program any stack position identification in advance. Certain embodiments provide for determination of a device's position in a stack of devices after the devices have been placed in the stack. Thus, stack positions can be determined based on connections made external to the memory device, where those connections may be in furtherance of a multiple pad to same signal mapping as part of a stack memory device structure.

Figure 7:
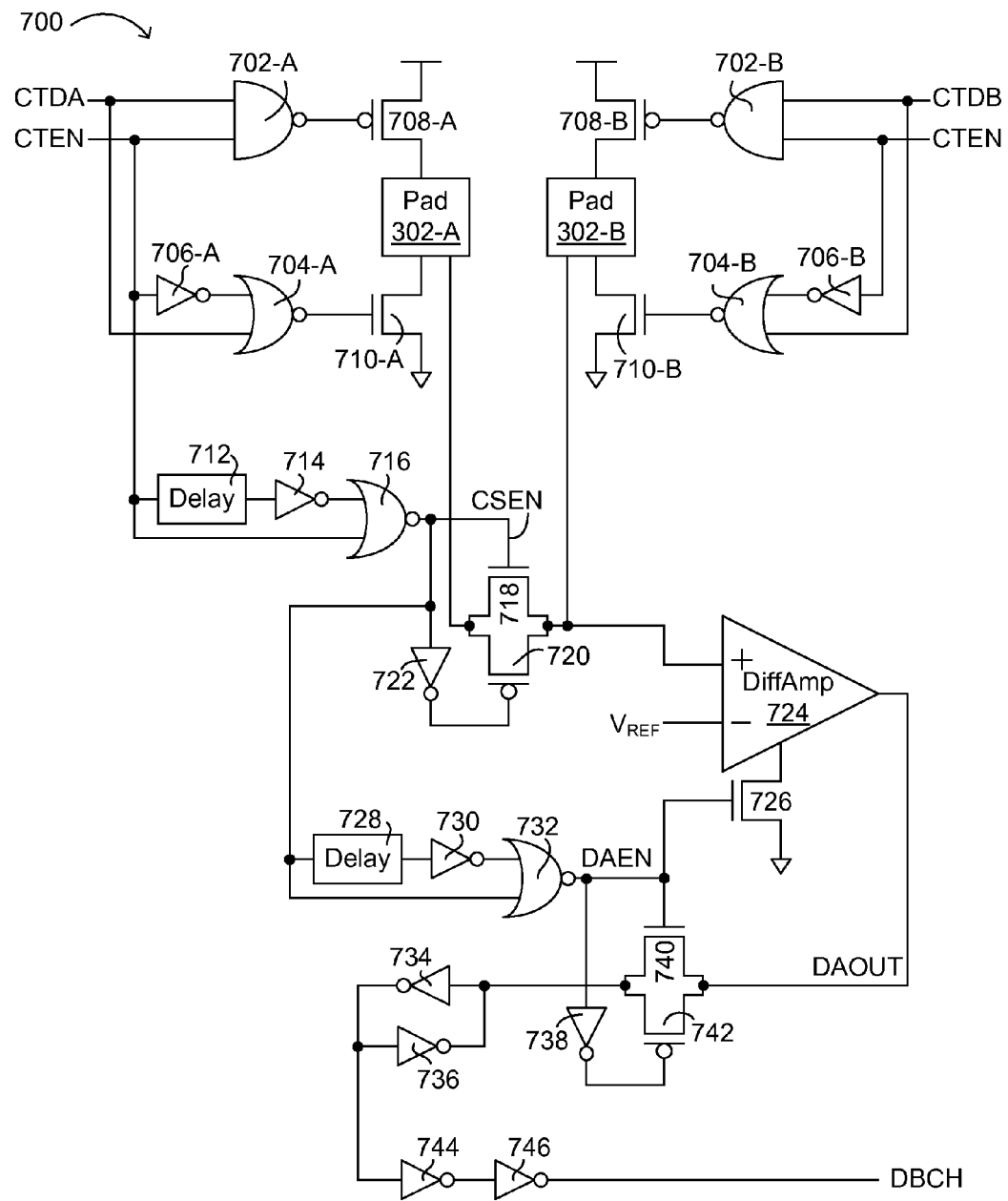
FIG. 7 is a block schematic diagram showing an example capacitance comparator.

Referring now to FIG. 7, shown is a block schematic diagram 700 of an example capacitance comparator. This particular circuit represents one example of a circuit for comparing capacitance in order to determine a stack position. When viewed in conjunction with FIG. 6, it can be appreciated that different pads (e.g., adjacent pads) may have different capacitances by virtue of the connections (e.g., TSVs 204, die-to-die vias 206, etc.). As such, pad 302-A and 302-B may represent adjacent pads, as will also be discussed below with reference to FIG. 9.

In the example circuit of FIG. 7, a data value (e.g., high, low, a predetermined voltage, etc.) for application to pad 302-A can be provided by a capacitance test data signal (e.g., CTDA) when enabled by test mode enable signal CTEN. For example, CTEN can be triggered off a power-up detect signal so that each device in the stack can determine its SPID upon power up. As another example, CTEN can be generated globally (e.g., from memory controller 102) for each chip to perform the capacitance comparison for automatic SPID determination. In some cases, CTDA may be a substantially static data value, while CTEN is a pulsed signal.

An example circuit to drive a high or low value (from CTDA) onto pad 302-A while CTEN is high, and to tri-state when CTEN is low, may include NAND gate 702-A, PMOS transistor 708-A, NOR gate 704-A, inverter 706-A, and NMOS transistor 710-A. A similar circuit that may be used to drive a high or low value (from CTDB) onto pad 302-B while CTEN is high, and to tri-state when CTEN is low, may include NAND gate 702-B, PMOS transistor 708-B, NOR gate 704-B, inverter 706-B, and NMOS transistor 710-B. During operation, CTDA and CTDB may be set to opposite values such that substantially equally differing levels are applied to pads 302-A and 302-B during the CTEN pulse.

Figure 8:
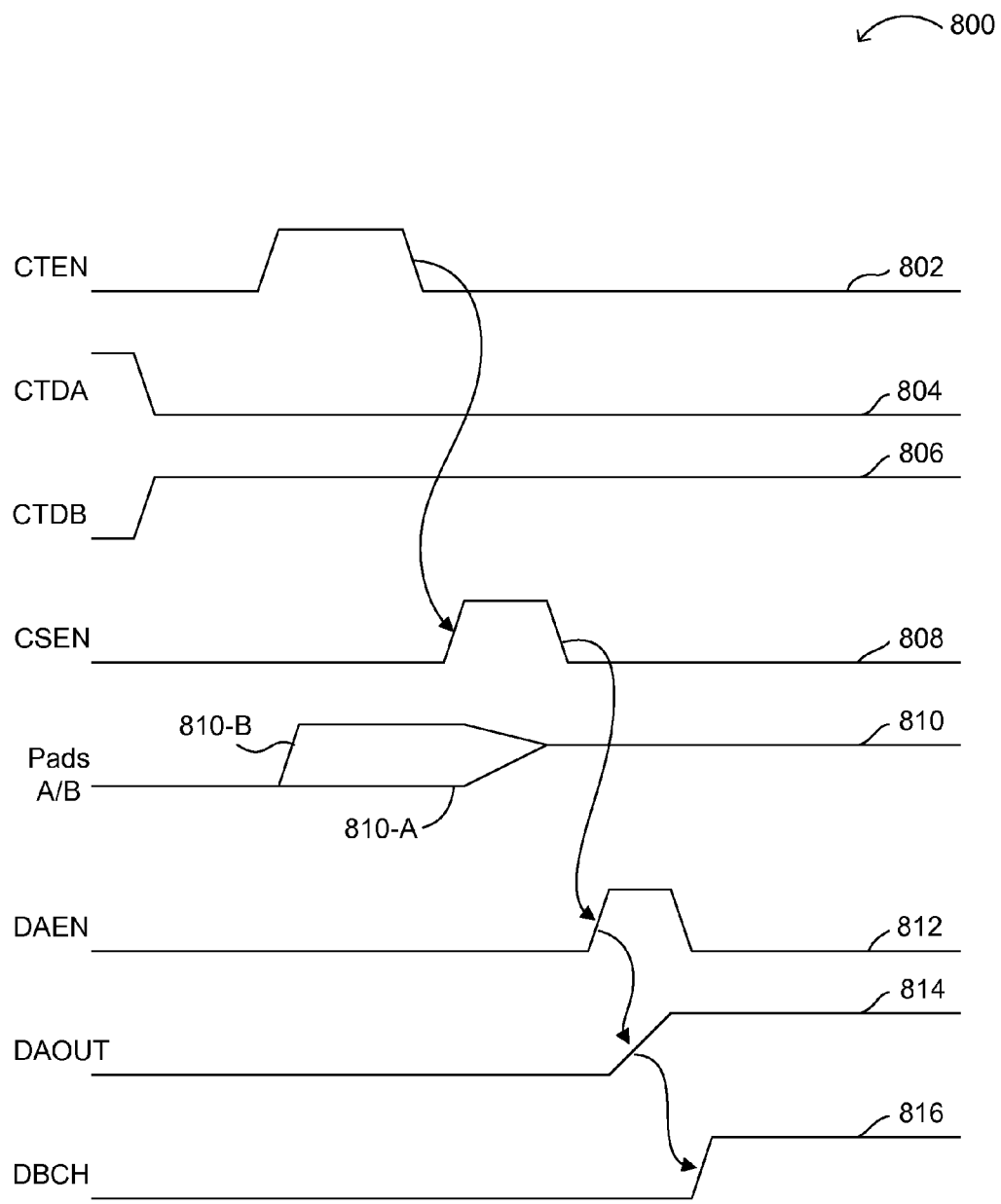
FIG. 8 is a timing diagram showing an example capacitance comparison between adjacent pads.

Referring also to FIG. 8, shown is a timing diagram 800 of an example capacitance comparison between adjacent pads, such as using the circuit of FIG. 7. In FIG. 8, an example operation of pulsed signal CTEN is shown in waveform 802, while an example operation of CTDA is shown in waveform 804 as being set low prior to the CTEN pulse, and an example operation of CTDB is shown in waveform 806 is being set high prior to the CTEN pulse.

At the falling edge of CTEN, an edge-triggered pulse CSEN indicating that capacitance sensing is enabled may be generated as shown in example waveform 808. For example, CSEN may be generated using delay circuit 712, inverter 714, and NOR gate 716 to generate a positive going edge-triggered pulse having a width of about that of delay circuit 712. For example, the delay of delay circuit 712 may be long enough to ensure adequate time to complete the charge sharing process between pads 302-A and 302-B. When CSEN is high (e.g., during the pulse) and its compliment is low via inverter 722, the pass gate formed by NMOS transistor 718 and PMOS transistor 720 can be enabled to allow charge sharing to occur between pads 302-A and 302-B. Because CSEN may not be triggered until a falling edge of CTEN, pass gate 718/720 may only be enabled when CTEN is low. Thus, pads 302-A and 302-B may be coupled together for charge sharing purposes only when the circuits that drive data onto the pads are tri-stated. For example, when CTEN is low, transistors 708-A and 710-A for pad 302-A, and transistors 708-B and 710-B for pad 302-B are off to place each path in tri-state.

An example of this charge sharing mechanism on pads 302-A and 302-B is shown respectively as waveforms 810-A and 810-B. In this particular example, both of pads 302-A and 302-B start out low, but pad 302-B may be charged high via transistor 708-B when CTEN is high. Thus in this example, CTDA may be low and CTDB may be high, as shown in respective waveforms 804 and 806. Once CTEN goes low and CSEN goes high to enable charge sharing between pads 302-A and 302-B, some intermediate voltage level can be established at the positive input of differential amplifier 724. As shown in example waveform 810, this intermediate voltage level after charge sharing may be higher than a middle value between the high and low levels applied, thus indicating that pad 302-B has a higher capacitance than pad 302-A.

Differential amplifier 724 may be used to compare the charge shared value input to a positive terminal against a predetermined reference level, V REF. For example, if the charge shared value is greater than VREF, then the differential amplifier output (DAOUT) may be high, but if the charge shared value is less than VREF, then DAOUT may be low. In order to ensure that differential amplifier 724 performs this comparison after the charge sharing is complete, a differential amplifier enable signal (DAEN) can be generated after a falling edge of CSEN. Thus, the falling edge of CSEN may trigger a high going pulse on DAEN by, for example, using the edge triggered pulse generation circuit that includes delay circuit 728, inverter 730, and NOR gate 732. Waveform 812 shows an example operation of DAEN, which can pulse high upon a falling edge of CSEN.

Once DAEN is high, NMOS transistor 726 may allow current to flow through and/or otherwise enable differential amplifier 724 such that DAOUT may provide an accurate output. DAEN may also be used with inverter 738 to open a pass gate formed by NMOS transistor 740 and PMOS transistor 742 to capture the value of DAOUT. When pass gate 740/742 is open by DAEN being high, which also enables differential amplifier 724, a value of DAOUT (see, e.g., waveform 814) can override the value stored in the latch formed by inverters 734 and 736. The output of latch 734/736 can be buffered by inverters 744 and 746 to provide output signal DBCH (see, e.g., waveform 816). For example, DBCH may go high to indicate that the capacitance at pad 302-B is greater than the capacitance at pad 302-A. Conversely, DBCH may be low the capacitance at pad 302-A were detected as greater than the capacitance at pad 302-B.

In this way, a capacitance comparison between two pads, or other external connection interfaces, can be performed in particular embodiments. Further, such capacitance comparison circuits may be employed as part of a test mode and/or as part of a standard powerup sequence. In certain embodiments, test modes and/or power-up sequences can include a sequenced activation for each memory device in the stack so that capacitance comparisons on a given chip are not interfered with by capacitance comparisons ongoing on a different chip. Further, such capacitance comparisons may be employed for other pad pairs, such as those that may not be mapped to a same signal. This may be useful as part of a test mode to detect external (e.g., TSV connections, etc.) on different pad or external connection pairs.

A test mode for capacitance comparisons may also be performed to determine whether a given pair of pads (e.g., pads 302-A and 302-B) have a same or matching capacitance. For example, matching capacitances can be determined by adjusting the level of V REF and/or by performing multiple tests with different values on CTDA and CTDB (e.g., first '1' and '0', then '0' and '1'). In this way, external connections to TSVs on a given device can be tested by using a test mode on that memory device. Further, other types of comparisons, such as resistance or current-based, as opposed to capacitance-based, may also be employed in particular embodiments.

Figure 9:
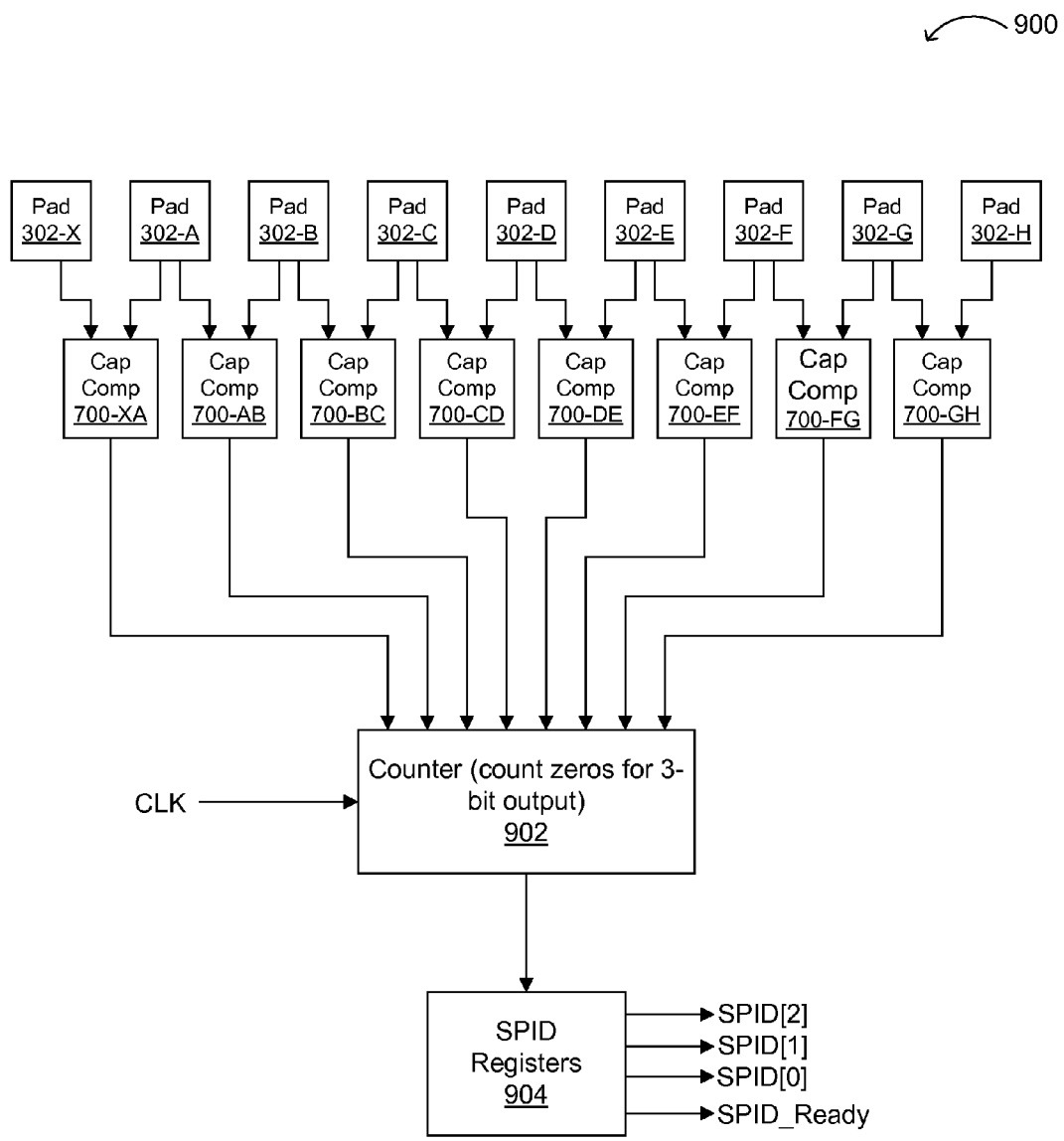
FIG. 9 is a block schematic diagram showing an example automatic SPID determiner using capacitance comparisons.

Referring now to FIG. 9, shown is a block schematic diagram 900 of an example automatic SPID determiner using capacitance comparisons. In order to determine SPID values for a given memory device, capacitance comparisons may be made for adjacent pads. For example, a given set of pads (or any external connection interface) that may be mapped to a same signal are shown as pad 302-A, pad 302-B, . . . pad 302-H. For example, pads 302-A, 302-B, . . . 302-H, may correspond to pads 302-0, 302-1, . . . 302-7 (see, e.g., 300-7 in FIG. 3). Also, a pad 302-X can be included for comparison with a first or end pad 302-A. For example, 302-X may be a test pad with or without extra external connections.

Example capacitance comparison circuits 700, as discussed with reference to FIGS. 7 and 8, may be used to compare each pair (e.g., an adjacent pair) of pads. For example, capacitance comparator 700-AB may be used to perform a capacitance comparison between pads 302-A and 302-B. Similarly, capacitance comparator 700-DE may be used to perform a capacitance comparison between pads 302-D and 302-E. Counter 902 may receive outputs from each of capacitance comparators 700, and may count a number of zeros to produce a 3-bit output based on the supplied clock, CLK. For example, CLK may be supplied in response to the test mode (e.g., that activates CTEN) and/or as part of power up sequencing. CLK activation may also be controlled to ensure that capacitance comparator outputs (e.g., DBCH of FIGS. 7 and 8) are settled prior to enabling the counting.

Once the count of zeros is completed, these values may be stored in SPID registers 904 to supply identifier bits SPID[2], SPID[1], and SPID[0]. Once the SPID register values are updated, SPID Ready may be activated to indicate that the values stored in SPID registers 904 are ready for use. For example, SPID Ready may be low to disable various circuits from using SPID values, and then may be brought high to indicate that SPID values are ready for use. An example of such zero value counting corresponding to SPID values is shown below in Table 2. Alternatively, "1" values may also be counted, or other correlations between adjacent pad capacitance determinations and ultimate SPID values can be performed. This particular example applies to the example external connection arrangement as shown in FIG. 6, but other types of external action arrangements, such as any other pattern for connecting a set of pads or as external connection interfaces that are mapped to a same signal, may also be accommodated.

TABLE 2

| Device | Comp XA, AB, BC, CD, DE, EF, FG, GH | SPID[2:0] |
| --- | --- | --- |
| DRAM-0 | 11111111 | 000 |
| DRAM-1 | 01111111 | 001 |
| DRAM-2 | 00111111 | 010 |
| DRAM-3 | 00011111 | 011 |
| DRAM-4 | 00001111 | 100 |
| DRAM-5 | 00000111 | 101 |
| DRAM-6 | 00000011 | 110 |
| DRAM-7 | 00000001 | 111 |

SPID registers 904 may also be part of, or otherwise associated with, a mode register, such as a mode register on a double data rate (DDR) DRAM. In one embodiment, default values may be stored in SPID registers 904 and/or the associated mode register positions for SPID. For example, a mode register may contain designated bits for SPID, or any other unique ID for each of a group of memory devices in a stack. The mode/SPID register may have a default setting upon power-up whereby each memory device in the stack has a same initial SPID value (e.g., SPID=000). Then, each command may be applied and recognized by each memory device of the stack. SPIDs for each memory device can subsequently be assigned or determined, such as by using the approach described above.

In one example, SPID registers 904 may contain resettable values to allow for commands to be accepted by each device in the stack of devices. For example, a mode register may be programmed to indicate a test mode or global command configuration, whereby SPID registers 904 are subsequently reset to a given value in response thereto. This approach provides an override mechanism for SPID registers 904 that can then be undone upon completion of the particular test mode or global command operation. For example, the determined SPID values could be stored in one latch and preserved throughout the test mode or global command configuration that overrides the SPID values, such that the determined SPID values could be restored thereafter. A control signal can be used to control a multiplexer to select either a stored SPID value from SPID registers 904, or an override value supplied via a mode register. As another example, a separate control signal (e.g., a global chip select signal) can be used when asserted to override SPID values to allow a same command to be accepted by each memory device in the stack.

Other example approaches for automatically determining SPID values can also be employed in certain embodiments. For example, a sequential SPID assignment approach may include use of a serially connected signal, as will be discussed below. In such connections, each memory device can receive a signal from an adjacent memory device, and perform operations (e.g., data modification, combinatorial logic, clocking adjustments, etc.) thereon. For example, given default SPID values of zero, an SPID value may be sent from one memory device to a next memory device located above in the stack of memory devices, and the receiving device may effectively add one to the received value, and then store that value as its SPID. Thus, each device can sequentially assign itself an SPID value. Certain embodiments may also support such a serially assigned SPID comparison mode against an SPID determined through another approach (e.g., capacitance comparison), as a way to double check SPID determination. For example, an error indication may be generated if such values do not match.

Also in particular embodiments, a test mode can connect one or more of various internal supplies together for one or more devices in a stack of devices. In one embodiment, a semiconductor memory device can include: (i) a stack position identifier for identifying a position of the semiconductor memory device in an aligned vertical stack of a plurality of semiconductor memory devices, where the plurality of semiconductor devices are coupled together via a common vertical connection; (ii) a test mode detector configured to determine a test mode in response to a received command and a match of the stack position identifier against the received command; (iii) a supply generator configured to generate an internal supply for the semiconductor memory device; and (iv) a supply coupler configured to couple the internal supply to the common vertical connection in response to the determined test mode.

Figure 10:
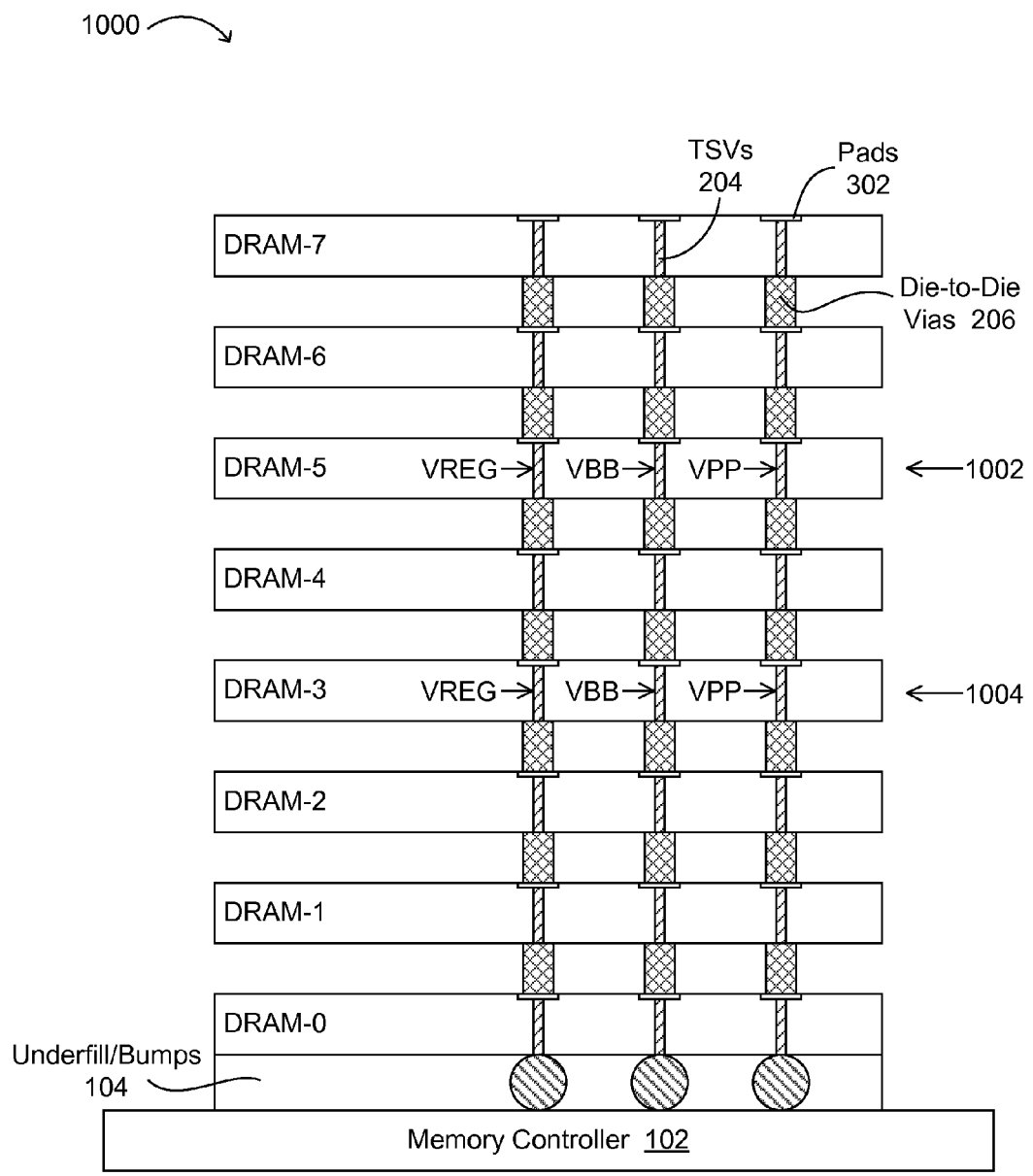
FIG. 10 is a cross-section diagram showing example internal supply connections across stacked DRAMs.

Referring now to FIG. 10, shown is a cross-section diagram 1000 of example internal supply connections across stacked DRAMs. Example internal supplies for DRAMs include negative bulk supply VBB, word line high level VPP, and other internal regulated levels, such as for the memory array, any of which may be represented here as VREG. In certain embodiments, one or more of pads 302, TSVs 204, and die-to-die vias 206 can be used to implement or allow common vertical connections to each DRAM and memory controller 102. Metal pads may be optional, but desirable due to accommodating probe level testing. Of course, other suitable patterns, internal supplies, etc., can have connections (e.g., common vertical connections) provided for as well.

One or more of the memory devices, such as DRAM-5 (see, e.g., 1002) and DRAM-3 (see, e.g., 1004) may have their internal supplies connected to an appropriate common vertical connection to allow for testing and/or monitoring via memory controller 102. In this way, internal supply generation circuits may be tested once the memory devices are placed in a stacked configuration. In addition, this configuration may also allow for an override of the internal supply of one or more memory devices in order to test the effects of different supply values. In this case, the internal supply circuitry may be disabled by this test mode for a given chip in order to allow for the override. Furthermore, if it is determined that a particular internal supply regulator has failed after the devices have been secured in the stacked configuration, this failed regulator may be supplemented or effectively replaced by another functioning regulator in a different device in the stack. For example, if the VPP charge pump is determined to have failed on DRAM-3, the VPP charge pump for DRAM-5 or an adjacent DRAM, may be connected to the VPP supply for DRAM-3 via the appropriate common vertical connection. Further, control for regulators of different chips in the stack may utilize SPIDs. In this way, a level of redundancy may be provided for internal supplies across memory devices.

In certain embodiments, test modes can allow for one, two, or any number of memory devices in a stack to connect internal supplies to a common vertical connection. For example, one test mode may provide for a sequential connection of a designated internal supply to a common vertical connection such that memory controller 102 or a test system may test a regulated supply from each memory device in the stack. The sequencing, which may be in any order of memory devices, such as a pre-programmed or random ordering of memory devices, can be controlled by use of SPIDs. For example, the test mode can be generated by a test device or memory controller 102, and associated test commands may be issued with an SPID designating that an internal supply be connected to a common vertical connection. In this way, internal supplies from each memory device in a stack of memory devices can be measured via a test mode after the memory devices are placed into the stack.

Figure 11:
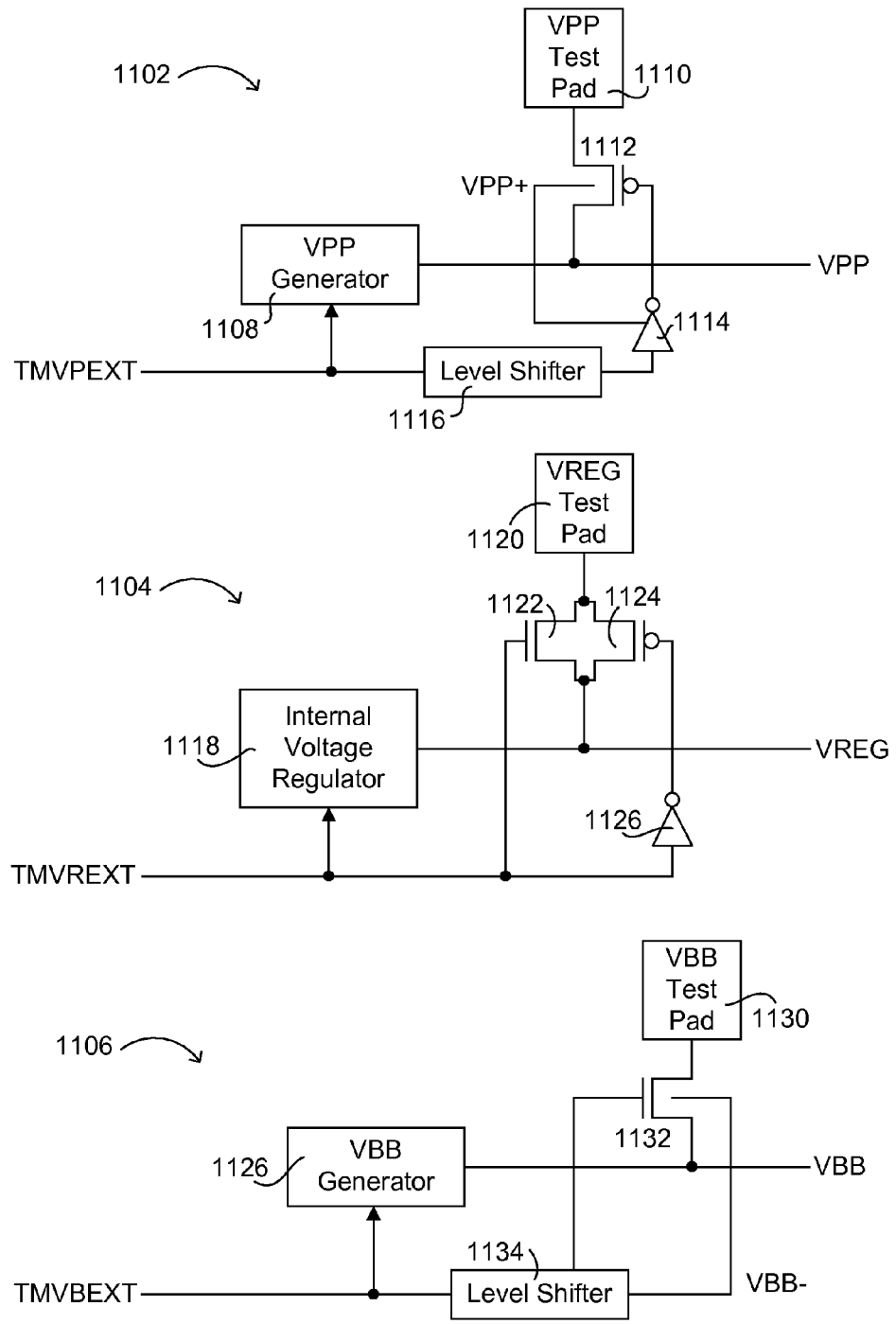
FIG. 11 is a block schematic diagram showing example selectors for connecting internal supplies to inter-chip TSV connections during a test mode.

Referring now to FIG. 11, shown is a block schematic diagram of example selectors for connecting internal supplies to inter-chip TSV connections during a test mode. As shown here in 1102, VPP test pad 1110 may represent the common vertical connection mapped to the VPP supply in FIG. 10. Similarly, VREG test pad 1120 shown in 1104 may represent the common vertical connection mapped to the VREG supply in FIG. 10, and VBB test pad 1130 shown in 1106 may represent the common vertical connection mapped to the VBB supply in FIG. 10. As noted above, other supplies or internal signals can also be mapped or allocated for possible connection to common vertical connections across stacked memory devices.

In 1102, VPP generator 1108 may normally be used to generate word line high supply VPP. In this example, test mode signal TMVPEXT may be used to indicate connection of VPP test pad 1110 to internal supply VPP by PMOS transistor 1112. Level shifter 1116 may be used to shift from a VDD-based signal (e.g., TMVPEXT) to a VPP or VPP+ (e.g., a level at least as high as VPP or the level of VPP test pad 1110, so as not to forward bias a P-N junction of transistor 1112), and inverter 1114 may also be supplied at this VPP+ level. In a mode whereby the signal at VPP test pad 1110 is to override the internally generated VPP supply, TMVPEXT may be used to disable VPP generator 1108. However, TMVPEXT or other suitable test mode and/or control signals may also be used to indicate to VPP generator 1108 that it needs to enable additional or redundant charge pump capabilities therein, such as when VPP generator 1108 is to act in a redundant capacity for a different DRAM device, as discussed above.

In 1104, internal voltage regulator 1118 may normally be used to generate regulated supply VREG. In this example, test mode signal TMVREXT may be used to indicate connection of VREG test pad 1120 to internal supply VREG by the pass gate formed by NMOS transistor 1122 and PMOS transistor 1124. Inverter 1126 may be used to control PMOS transistor 1124 and in complementary fashion to control NMOS transistor 1122. In a mode whereby the signal at VREG test pad 1120 is to override the internally generated VREG supply, TMVREXT may be used to disable internal voltage regulator 1118. However, TMVREXT or other suitable test mode and/or control signals may also be used to indicate to internal voltage regulator 1118 that it needs to enable additional or redundant supply capabilities therein, such as when internal voltage regulator 1118 is to act in a redundant capacity for a different DRAM device, as discussed above.

In 1106, VBB generator 1126 may normally be used to generate bulk low supply level VBB, to reverse bias P-WELLS under the memory cells for cell leakage reduction. In this example, test mode signal TMVBEXT may be used to indicate connection of VBB test pad 1130 to internal supply VBB by NMOS transistor 1132. Negative level shifter 1134 may be used to shift from a VDD-based signal (e.g., TMVBEXT) to a VBB or VBB- (e.g., a level at least as low or negative as VBB or the level of VBB test pad 1130. In a mode whereby the signal at VBB test pad 1130 is to override the internally generated VBB supply, TMVBEXT may be used to disable VBB generator 1126. However, TMVBEXT or other suitable test mode and/or control signals may also be used to indicate to VBB generator 1126 that it needs to enable additional or redundant negative charge pump capabilities therein, such as when VBB generator 1126 is to act in a redundant capacity for a different DRAM device, as discussed above.

Thus, each of VPP generator 1108, internal voltage regulator 1118, and VBB generator 1126 may be designed such that additional regulation or pumping capabilities may be enabled to support other memory devices in the stack via an appropriate common vertical connection. Further, each of VPP generator 1108, internal voltage regulator 1118, and VBB generator 1126 may be designed to be disabled under certain situations, such as when it is to be replaced by a corresponding regulator/generator (e.g., one with enhanced regulating or pumping capabilities enabled) from another memory device and the stack.

In particular embodiments, SPID bits may be used in order to isolate which memory devices are to be configured in a test mode, such as in a supply override test mode, or a redundant supply test mode, etc., as discussed above. For example, circuitry to generate various test mode signals (e.g., TMVPEXT, TMVREXT, TMVBEXT, etc.) may be generated by use of chip select signals sent with the test mode command (e.g., from memory controller 102) matching with the SPID of a particular device. As another example, bit settings to provide a mapping as to the types of supply accesses via a common vertical connection may also be utilized. For example, a table that includes SPIDs and corresponding settings, such as VPP override, VBB override, providing redundancy for a device identified by different SPID, etc., may be utilized in order to manage various supply related test modes. In some applications, such a table may be stored on memory controller 102 such that test mode or other such regulator setting commands as discussed herein may be sent to the proper memory devices for configuration of the supplies by use of and SPIDs corresponding common vertical connections.

In various embodiments, a self-refresh timing adjustment can be made based on a position of a device in a stack of such devices. In one embodiment, a semiconductor memory device can include: (i) a stack position identifier for identifying a position of the semiconductor memory device in an aligned vertical stack of a plurality of semiconductor memory devices; (ii) a self-refresh oscillator configured to generate an oscillating signal to control a rate of self-refresh operations for the semiconductor memory device; and (iii) an oscillator adjustor configured to increase the self-refresh oscillator from a first frequency to a second frequency in response to the stack position identifier when the stack position identifier indicates that the semiconductor memory device is higher in the aligned vertical stack than at least one of the plurality of semiconductor memory devices.

Figure 12:
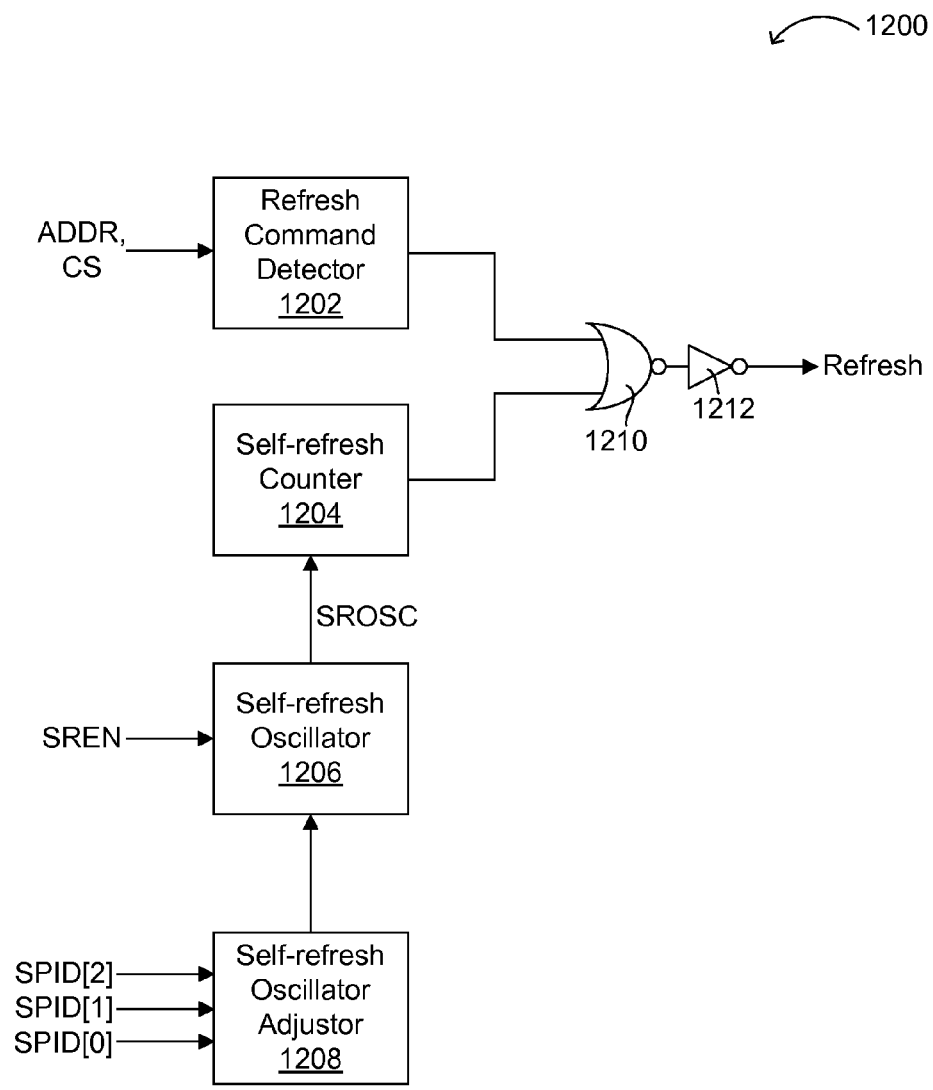
FIG. 12 is a block schematic diagram showing an example self-refresh controller based on SPID.

Referring now to FIG. 12, shown is a block schematic diagram 1200 of an example self-refresh controller based on SPID. As temperature increases, DRAM storage cell leakage may also increase. Further, temperatures are likely to increase the higher a memory device is in a stack of memory devices. In certain embodiments, a DRAM may adjust a self-refresh rate based on its position in the stack of memory devices in an aim to counter the increased temperature effects as to storage cell leakage. Also, to the extent that TTSVs or other temperature equalizing methods are utilized, SPIDs can be used to identify any memory device in the stack that may benefit from an increase in its refresh rate, and accordingly adjust the refresh rate from a default rate to a higher (e.g., a predetermined) rate.

A standard refresh command (e.g., from address or other control signals) may be detected using refresh command detector 1202. A separate self-refresh counter 1204 (e.g., a wraparound counter) can be used to determine when a self-refresh cycle should occur. Thus, a refresh operation can effectively occur when either a refresh command is detected or a self-refresh counter indicates that it is time for a self-refresh operation. For example, NOR gate 1210 and inverter 1212 can be used to trigger a refresh operation from either refresh command detector 1202 or self-refresh counter 1204.

A self-refresh enable signal (SREN) may be used to enable isolation of self-refresh oscillator 1206. Thus, if self-refresh is not enabled, SREN may be low to disable operation of self-refresh oscillator 1206, resulting in a fixed, as opposed to an oscillating, signal at SROSC. If SROSC is fixed instead of oscillating or clocking, self-refresh counter 1204 may not update to get closer to another self-refresh operation. However, if SROSC is oscillating, a rate or frequency of oscillation therefrom may determine how often self-refresh counter 1204 reaches a value (e.g., all '1' or logic high levels) that can result in initiation of a refresh operation.

In certain embodiments, self-refresh oscillator adjustor 1208 can receive SPID bits, and provide an adjustment to self-refresh oscillator 1206 in response thereto. For example, the higher the memory device is in the stack of memory devices, as indicated by its SPID, the higher the frequency of SROSC. This represents one example of how self-refresh frequency may be increased to help compensate for increased storage cell leakage due to increased temperatures. Of course, one skilled in the art will recognize that adjustments may also, or alternatively, be made to self-refresh counter 1204 in order to increase a self-refresh frequency as one goes higher up in a stack of memory devices. Alternatively, as discussed above, a device can be configured to change from a default refresh rate to a higher refresh rate based on SPID matching, where the device does not necessarily have to be higher in the stack than a given device in order to make the adjustment.

Figure 13:
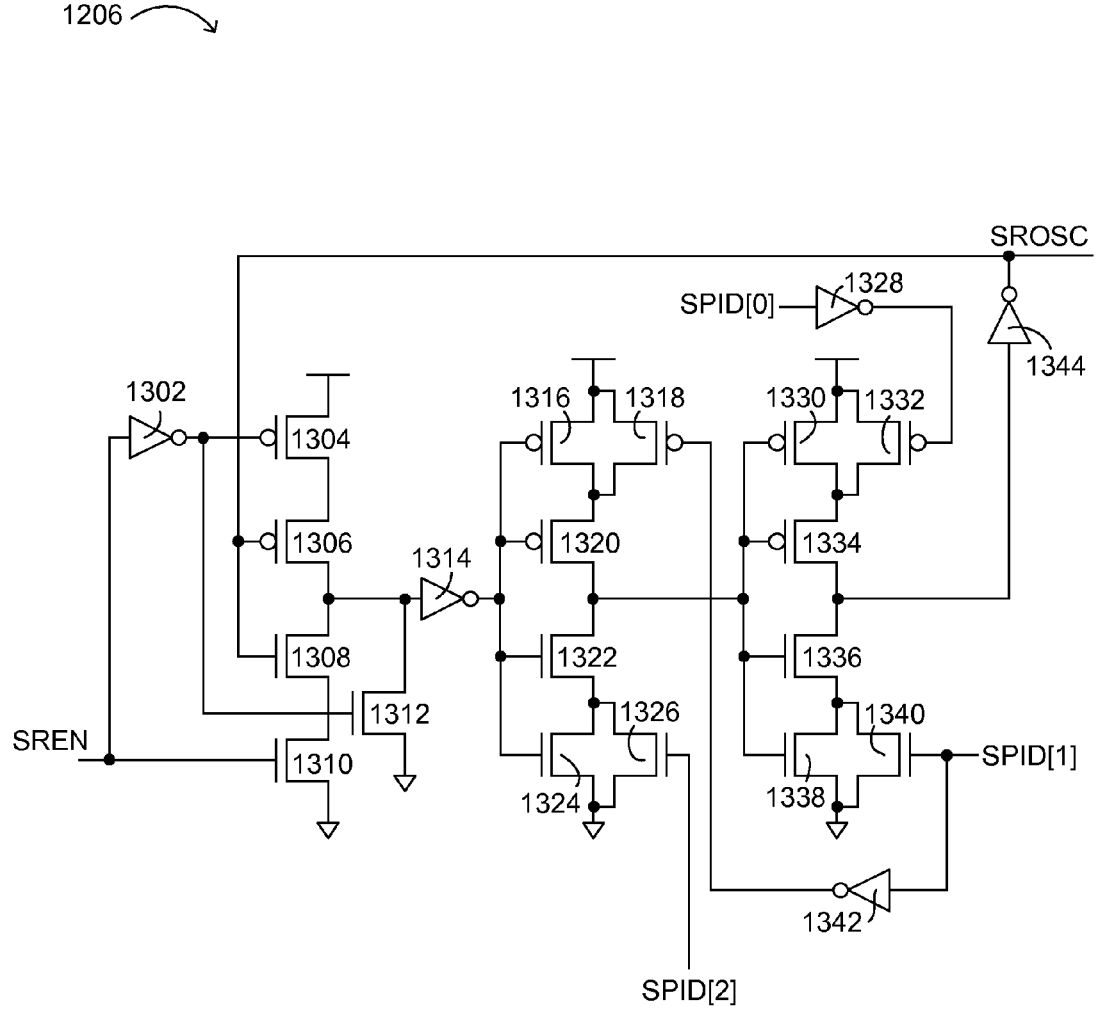
FIG. 13 is a block schematic diagram showing an example self-refresh oscillator adjustment based on SPID.

Referring now to FIG. 13, shown is a block schematic diagram of an example self refresh oscillator adjustment based on SPID. In this example, self-refresh oscillator 1206 is adjusted based on SPID bits. This particular example is a five stage oscillator that includes a first stage with PMOS transistor 1306 and NMOS transistor 1308. When enabled by SREN, PMOS transistor 1304 and NMOS transistor 1310 are on, while NMOS pull-down transistor 1312 is off. Inverter 1302 may invert SREN to control PMOS transistor 1304 and NMOS pull-down transistor 1312. Thus, transistors 1304, 1310, and 1312 may be used to enable or disable self refresh oscillator 1206 based on enable signal SREN.

The second stage of self-refresh oscillator 1206 may be inverter 1314, and the third stage may include PMOS transistors 1316 and 1320, and NMOS transistors 1322 and 1324. The fourth stage may include PMOS transistors 1330 and 1334, and NMOS transistors 1336 and 1338. The fifth stage may include inverter 1344 that drives SROSC and provides feedback to control the first stage at transistors 1306 and 1308. Various other transistors may be included in order to reduce resistance in a particular path when enabled, in order to speed up that particular stage. For example, NMOS transistor 1326 can be enabled by SPID[2] such that a pull down path through transistor 1322 can be sped up when SPID[2] is high because of the parallel resistance effect of transistors 1324 and 1326. SPID[2] being high can indicate that the memory device is in a top half of the stack of memory devices, and SPID[2] being low may indicate that the memory device is in a bottom half of the stack of memory devices. Thus, memory devices in a top half of the stack may have an increased self-refresh rate based on their SPIDs.

The third stage may also be adjusted via PMOS transistor 1318 which may be on (by way of inverter 1342) when SPID [1] is high. The fourth stage may include adjustment PMOS transistor 1332 which can be turned on by way of inverter 1328 when SPID[0] is high. Also, the fourth stage may include adjustment NMOS transistor 1340 that can be turned on when SPID[1] is high. Table 3 below shows various adjustments in oscillator stages that can be made based on SPID values.

In this way, a self-refresh oscillator can be adjusted according to SPID bits. Of course, this represents just one example, and certain embodiments are amenable to a variety of circuit design choices as to how refresh frequency adjustment can be made based on SPID values. For example, different stages can be adjusted in the self-refresh oscillator, and also different numbers of stages can be employed. Further, self-refresh counter 1204 may alternatively, or in addition to, be adjusted based on SPID values. Finally, SPID-based self-refresh frequency adjustment may supplement other forms (e.g., temperature sensor-based) of self-refresh adjustment. For example, SPID-based self-refresh adjustment may represent a coarse tuning, while temperature sensor-based self-refresh adjustment may represent a finer adjustment, or vice versa.

TABLE 3

| Device | SPID[2:0] | 1326 | 1318 | 1340 | 1332 |
|---|---|---|---|---|---|
| DRAM-0 | 000 | off | off | off | off |
| DRAM-1 | 001 | off | off | off | on |

TABLE 3-continued

| Device | SPID[2:0] | 1326 | 1318 | 1340 | 1332 |
|---|---|---|---|---|---|
| DRAM-2 | 010 | off | on | on | off |
| DRAM-3 | 011 | off | on | on | on |
| DRAM-4 | 100 | on | off | off | off |
| DRAM-5 | 101 | on | off | off | on |
| DRAM-6 | 110 | on | on | on | off |
| DRAM-7 | 111 | on | on | on | on |

In particular embodiments, internal regulated supply adjustment can be performed based on stack position identification. In one embodiment, a semiconductor memory device can include: (i) a stack position identifier for identifying a position of the semiconductor memory device in an aligned vertical stack of a plurality of semiconductor memory devices; (ii) a regulator circuit configured to generate a supply for the semiconductor memory device; and (iii) a regulator adjustment circuit configured to adjust the supply from a first voltage level to a second voltage level in response to the stack position identifier when the stack position identifier indicates that the semiconductor memory device is higher in the aligned vertical stack than at least one of the plurality of semiconductor memory devices.

Figure 14:
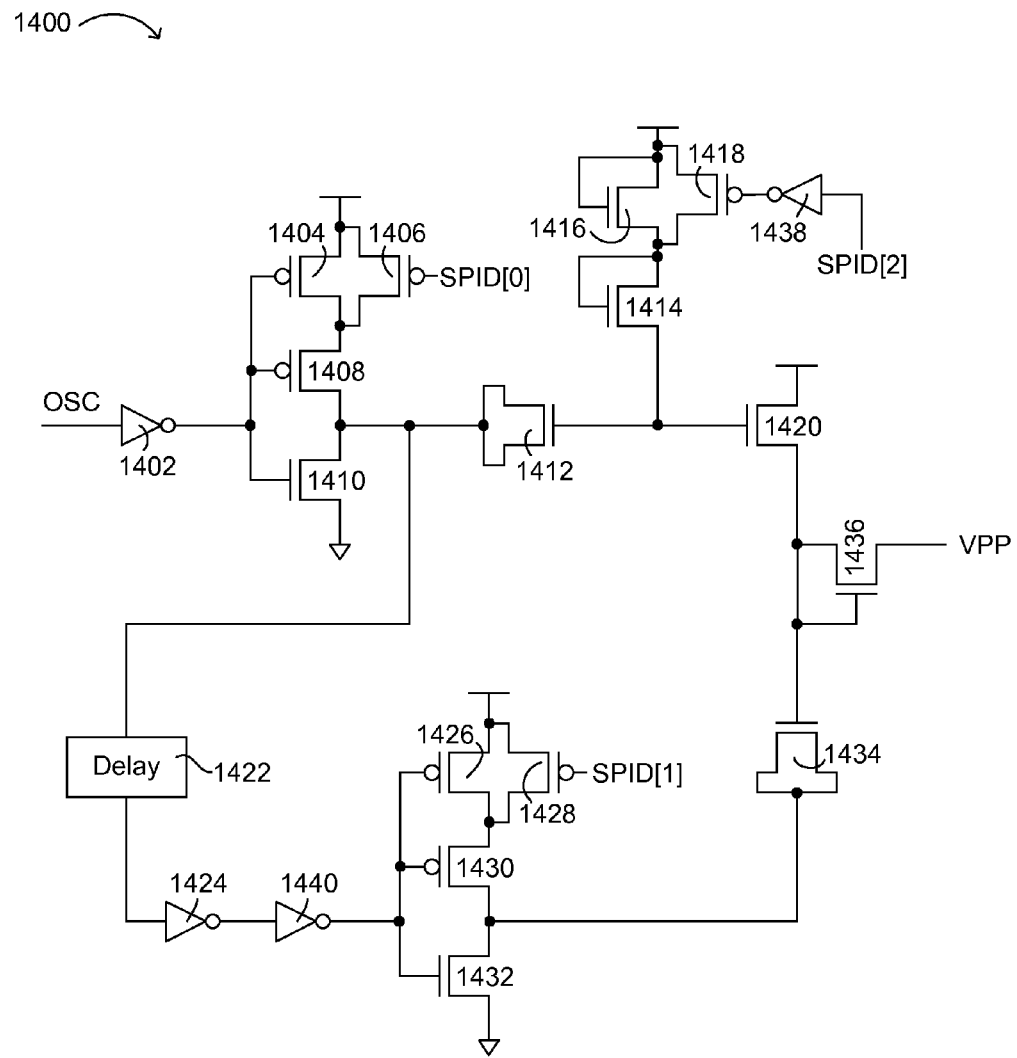
FIG. 14 is a block schematic diagram showing an example charge pump with VPP level adjustment based on SPID.

Referring now to FIG. 14, shown is a block schematic diagram 1400 of an example charge pump with VPP level adjustment based on SPID. In this particular example, a charge pump design for a word line high (e.g., greater than VDD+$V_{TN}$) level can be adjusted based on a position of a memory device in a stack. An oscillating signal (OSC) may be received at inverter 1402 to control a charge pump cycle. NMOS transistor 1412 may be configured as a capacitor in order to capacitively couple a high level to a gate of NMOS transistor 1420 in order to fully precharge main pumping capacitor 1434 (e.g., an NMOS transistor configured as a capacitor).

When OSC is low, PMOS transistors 1404 and 1408 may be off, while NMOS transistor 1410 may be on to discharge the source/drain side of transistor 1412, which is connected in a capacitor configuration. Diode connected NMOS transistors 1414 and 1416 (when PMOS transistor 1418 is off) may charge a gate side of transistor 1412 to a level of about VDD−2*$V_{TN}$. When OSC is high, NMOS transistor 1410 may be off, while PMOS transistors 1404 and 1408 may be on in order to charge the source/drain side of transistor 1412. Through capacitive coupling, the gate of NMOS transistor 1420 may be raised to a level of about 2*(VDD−$V_{TN}$).

Also when OSC is low, and the low level has passed through delay 1422 and inverter 1424, inverter 1440 may drive a high level at the gates of PMOS transistors 1426 and 1430, and NMOS transistor 1432. This may discharge the source/drain connection of capacitor connected NMOS transistor 1434. When OSC goes high, after delay 1422, transistors 1426 and 1430 may charge the source/drain of 1434 to a VDD level. The previous precharge cycle on the gate side of 1434 may have precharged via NMOS transistor 1420 (with a gate that is capacitively coupled to greater than VDD+$V_{TN}$) such that a charge pump action may reach 2*VDD at a gate side of 1434, pumping out of diode connected NMOS transistor 1436 to the VPP node a level of about 2*VDD−$V_{TN}$.

Of course, this represents only one example of a possible charge pump circuit, and any suitable charge pump or regulating circuit may be adjusted based on a position of the memory device in a stack by using SPID. In the particular example of FIG. 14, parallel transistors may be used to reduce resistance in a path to improve charge coupling, and/or to shunt the effects of diode connected transistors. As shown, SPID[2] may control PMOS transistor 1418 via inverter 1438 in order to shunt the effects of diode connected NMOS transistor 1416, which may result in a lower precharge level at a gate of transistor 1420, and an associated lower precharge level at a gate of transistor 1434. As a result, a VPP level may be higher for devices in the top half of the stack (e.g., when SPID[2] is high), and lower for devices in the bottom half of the stack (e.g., when SPID[2] is low).

Other example adjustments can include SPID[0] controlling PMOS transistor 1406, which can reduce the resistance through the pull-up path for the source/drain connection of 1412 when SPID[0] is low. Also, PMOS transistor 1428 can reduce the resistance through the pull-up path for the source/drain connection of main pumping capacitor 1434 when SPID[1] is low. Table 4 below shows example states of various adjustment transistors, which may generally be configured to increase a level of VPP as one goes up a stack of memory devices.

TABLE 4

| Device | SPID[2:0] | 1406 | 1418 | 1428 |
|---|---|---|---|---|
| DRAM-0 | 000 | on | off | on |
| DRAM-1 | 001 | off | off | on |
| DRAM-2 | 010 | on | off | off |
| DRAM-3 | 011 | off | off | off |
| DRAM-4 | 100 | on | on | on |
| DRAM-5 | 101 | off | on | on |
| DRAM-6 | 110 | on | on | off |
| DRAM-7 | 111 | off | on | off |

Of course, other internally regulated supplies (e.g., VBB, VBLR, VREG, etc.) can also be adjusted based on SPID in particular embodiments. For example, a word line low level (e.g., to a negative value to reduce leakage effects as temperature increases) may also be adjusted using SPID values. Further, SPID-based supply regulation adjustment may supplement other forms (e.g., temperature sensor-based) of regulation adjustment. For example, SPID-based supply adjustment may represent a coarse tuning, while temperature sensor-based supply adjustment may represent a finer adjustment, or vice versa.

In particular embodiments, a chip select valid command detector can be based on stack position identifier. In one embodiment, a semiconductor memory device can include: (i) a stack position identifier for identifying a position of the semiconductor memory device in an aligned vertical stack of a plurality of semiconductor memory devices, where the plurality of semiconductor devices are coupled together via a plurality of common vertical connections; (ii) a receiver configured to receive a plurality of chip select signals from the plurality of common vertical connections; and (iii) a command detector configured to detect whether a command is intended for the semiconductor memory device based on a comparison of the received plurality of chip select signals against the stack position identifier.

Figure 15:
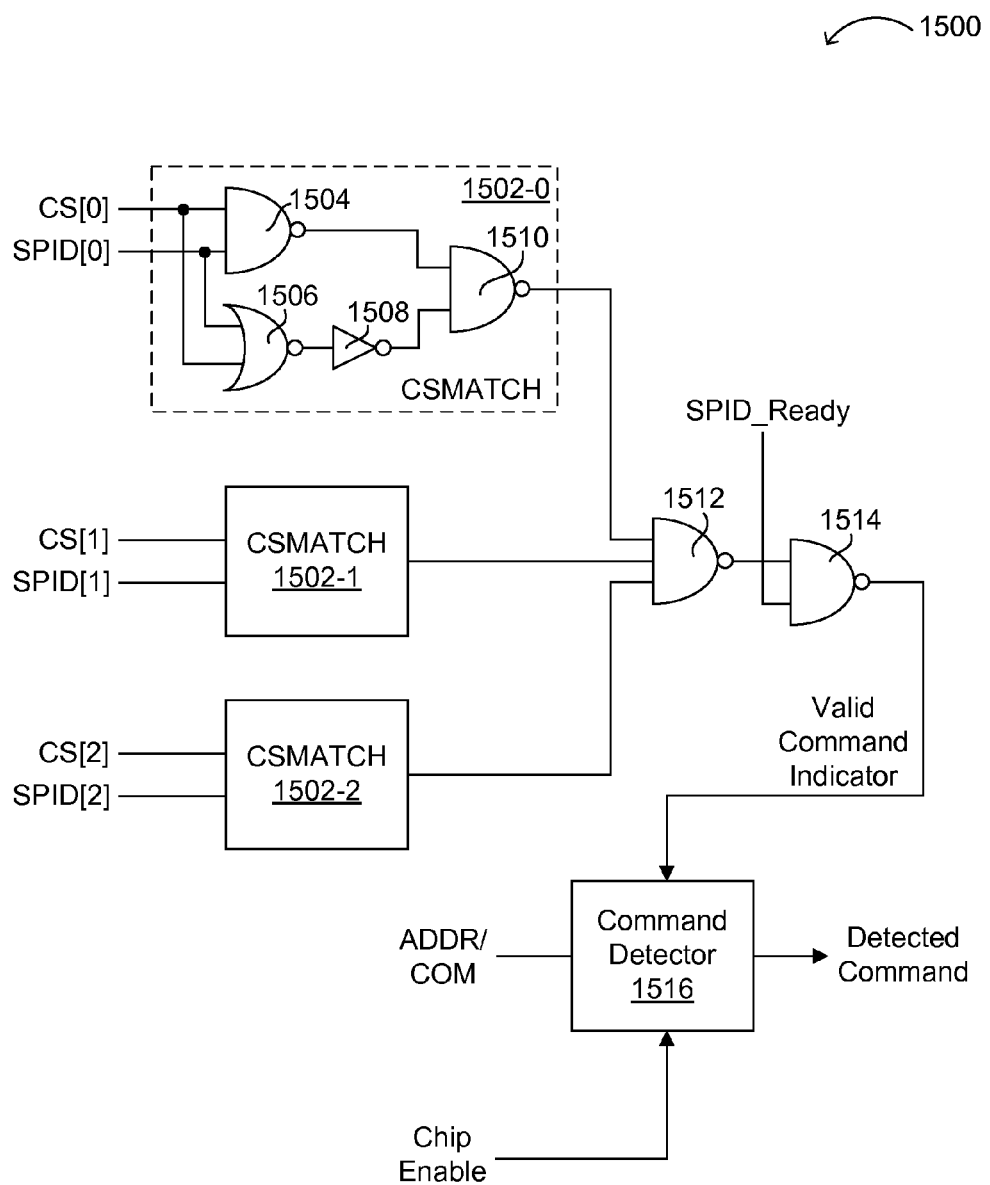
FIG. 15 is a block schematic diagram showing an example chip select and SPID matching circuit.

Referring now to FIG. 15, shown is a block schematic diagram 1500 of an example chip select and SPID matching circuit. In this example, chip select match circuits 1502 can be used to compare chip select signals against corresponding SPID bits. For example, CS[0] can be compared against SPID[0] in CSMATCH 1502-0. If both CS[0] and SPID[0] are high, the output of NAND gate 1504 may be low, and NAND gate 1510 may output a high. Also, if both CS[0] and SPID[0] are low, the output of NOR gate 1506 may be high, the output of inverter 1508 low, and NAND gate 1510 may output a high.

Thus, if each bit of CS matches each corresponding bit of SPID, NAND gate 1512 may output a low.

SPID_Ready (see, e.g., FIG. 9) being high may indicate that the SPID signals are available or enabled for comparison purposes, and thus NAND gate 1514 may effectively act as an inverter. However, if SPID_Ready is low, this may indicate that the SPID signals are somehow not ready or not enabled for comparison purposes. For example, upon chip power-up and/or when an automatic SPID assignment mode is being used, SPID_Ready may remain low to hold off use of SPID bits until they are settled for that device. As another example, the SPID_Ready signal may be used to enable a given command (e.g., sent from memory controller 102) for each memory device in the stack of devices. In one example, SPID_Ready may be related to a global chip select signal (e.g., separate from CS[2:0]) that enables a command to be accepted in each memory device in the stack. In this way, commands may be presented in a global fashion where each device detects the same command, or commands can be applied to certain devices based on matching of CS bits with corresponding SPID bits.

Thus when either the SPID signals are not enabled (e.g., SPID_Ready is low), or when a bit-by-bit matching of CS and SPID indicates that a command is intended for a given memory device, a valid command indicator may be sent to command detector 1516. In this way, command detector 1516 may apply the valid command indicator to a command received (e.g., via address and/or control signals) in order to determine a detector command. Thus, a command received may be ignored by particular device if any bit of the bit-by-bit matching of CS and SPID results in a mismatch.

Particular embodiments may utilize the common vertical connections (see, e.g., FIG. 2) for each memory device in a stack of devices in order to route CS signals that can then be compared against SPID on each memory device. Thus, for eight memory devices in a stack, only three CS signals need be routed in a common vertical connection. Similarly, such decoding can be employed for any number of memory devices in a stack, as opposed to routing separate vertical connections for each CS signal. Further, default and other command controls can be utilized to control a signal for bypassing of this comparison of CS to SPID in order to make a given command applicable to each memory device in the stack. As one example, a test mode may also be used whereby SPID Ready or another such enabling signal may be used to disable chip specific matching of CS to SPID in order to allow commands to be applicable to each memory device in the stack.

A chip-level redundancy or de-allocation of a memory device using SPIDs may also be supported in particular embodiments. If, for example, even though KGD testing may indicate that each memory device to be placed in the stack is good, some failure modes may occur as a result of chip interconnections or other factors after a device is secured in the stack. In certain embodiments, redundancy or chip disable may be employed to address failed chips after placement in the stack. For example, the chip enable signal may be used to disable further commands to a given device via command detector 1516 when low. This chip enable signal may be derived from a latch or other setting that indicates that the given chip is to be disabled. In this case, some other device operations (e.g., internal voltage regulation and supply, memory cell reading and writing, etc.) may be disabled, but other device operations (e.g., passing signals between adjacent devices for serially connected pads, as discussed below) may be maintained.

Further, chip-level redundancy can be employed, such as in case when 9 memory devices instead of 8 are placed in the stack, where the extra memory device can be substituted for the bad device by using SPIDs and other controls. For example, address and other control signals may be applied in a parallel fashion to each memory device in the stack, but DQ signals may be parallelized such that each device contributes a given number of DQs (e.g., 64) in order to form a wide I/O (e.g., 512-bits wide) memory structure. Thus, the memory device that provides redundancy can have its DQ signals multiplexed or selected in place of the de-allocated memory device. In this way, the redundant memory device DQ signals may be steered (e.g., using pad selection circuitry as discussed above with reference to FIG. 4 with an added redundant path pad) to effectively assume a position of the DQ signals for the de-allocated memory device in the stack. In addition, parity bits may also be supported, such as by using a $9^{th}$ memory device in the stack of memory devices in order to supply parity data. In one embodiment, such a device designated for parity data may instead be allocated as the redundant replacement device in the event of a failure of another memory device in the stack.

In particular embodiments, signal latency may also be adjusted based on a position of a device in a stack of devices by using a stack position identifier. In one embodiment, a semiconductor memory device can include: (i) a stack position identifier for identifying a position of the semiconductor memory device in an aligned vertical stack of a plurality of semiconductor memory device; (ii) a latency determiner configured to determine a programmed latency from a mode register on the semiconductor memory device; and (iii) a latency adjustor configured to adjust the programmed latency in response to the stack position identifier.

Figure 16:
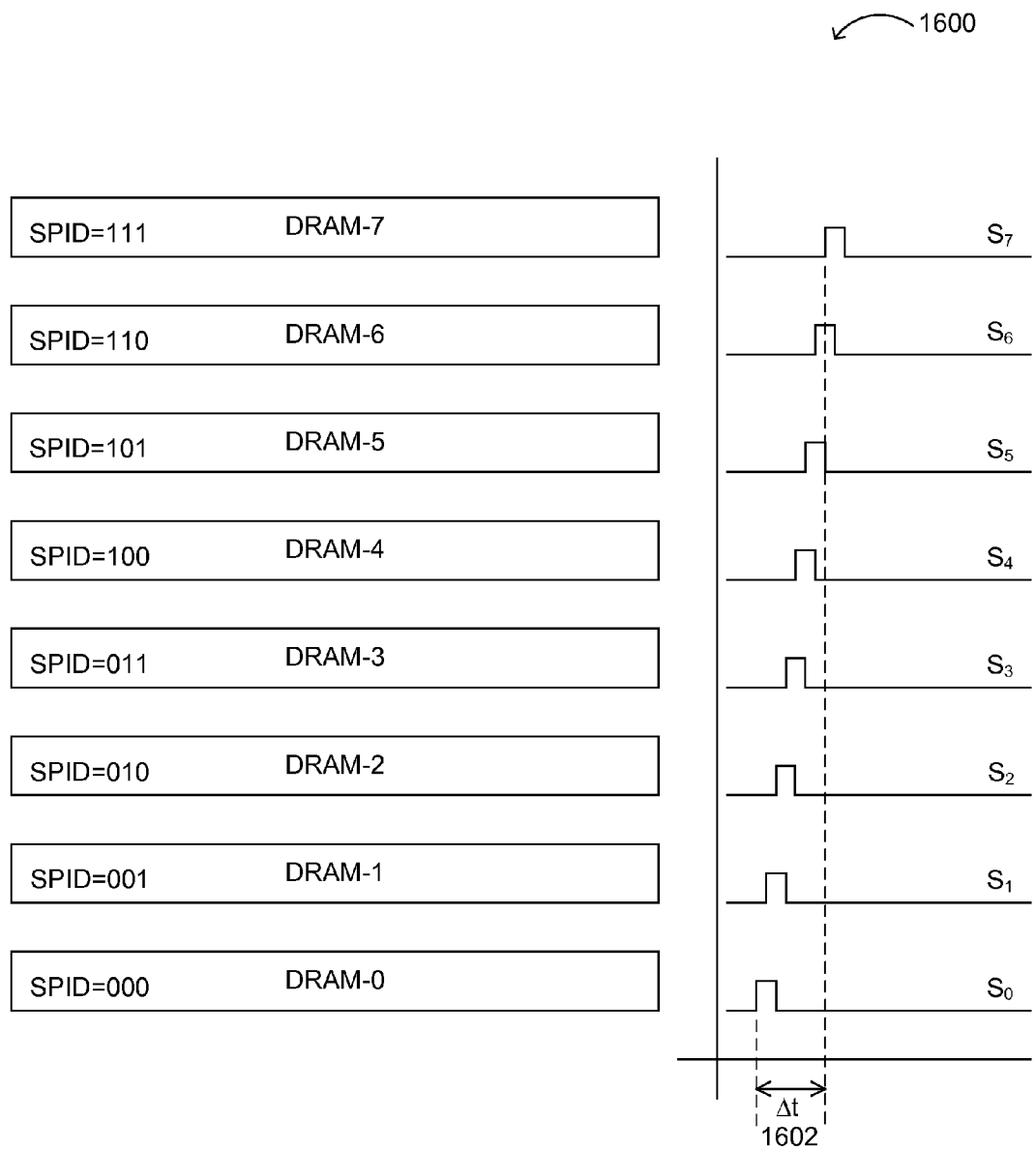
FIG. 16 is a diagram showing example latency variations for stacked memory devices.

Referring now to FIG. 16, shown is a diagram 1600 of example latency variations for stacked memory devices. As seen at a controller (e.g., memory controller 102) or a common substrate or interface, a time delta due to latency variations may exist. For example, time delta 1602 may represent a time difference between signal $S_0$ to/from DRAM-0, as compared to signal $S_7$ to/from DRAM-7. In some cases, depending on the number of devices in the stack, as well as the TSV 204 and/or die-to-die via 206 routing, materials used, type of signaling, etc., this time delay may be significant. In particular, such a time delta or time variation between memory devices may cause timing problems at a memory controller, such as when different DQs are arriving from different memory devices as part of a very wide I/O configuration (e.g., 512-bit wide I/O, where 64-bits are coming from each memory device).

Figure 17:
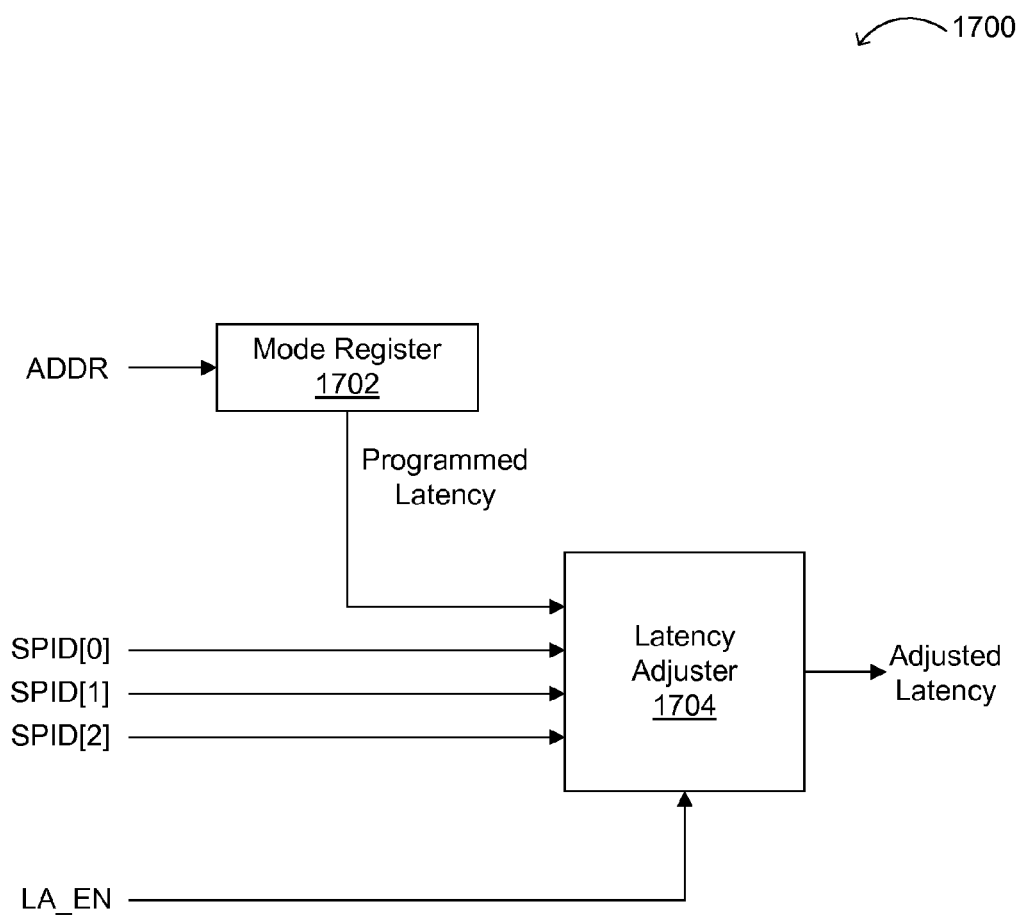
FIG. 17 is a block schematic diagram showing example latency adjustment based on SPID.

Referring now to FIG. 17, shown is a block schematic diagram 1700 of an example latency adjustment based on SPID. Various latency settings, such as CAS latency, additive latency, CAS write latency, read latency, etc., may be programmed into mode register 1702. However, certain embodiments allow for additional automatic latency adjustments based on SPIDs, which may alternatively be stored in mode register 1702, that indicate stack position. Thus, latency adjustor 1704 may add additional latency as one goes down a stack of memory devices in order to even out the latency as seen at memory controller 102, or another common interface. In addition, an enable signal (LA_EN) may be used to enable or disable this feature. For example, some applications may have sufficient latency adjustments based on the latency programmed into mode register 1702. However, other applications may want automatic stack position based latency adjustment to occur, and as such LA_EN may be activated so as to allow latency adjustor 1704 to adjust a programmed latency based on stack position.

In particular embodiments, latency adjustment or alignment can be performed using a data strobe on a common vertical connection. In one embodiment, a semiconductor memory device can include: (i) a stack position identifier for identifying a position of the semiconductor memory device in an aligned vertical stack of a plurality of semiconductor memory devices, where the plurality of semiconductor memory devices are coupled together via a data strobe connection; (ii) a phase detector configured to detect a phase of the data strobe relative to a data signal; and (iii) a phase adjustor configured to delay the data signal to match the data strobe, wherein the data strobe is driven by one of the plurality of semiconductor memory devices based on the stack position identifier.

Figure 18:
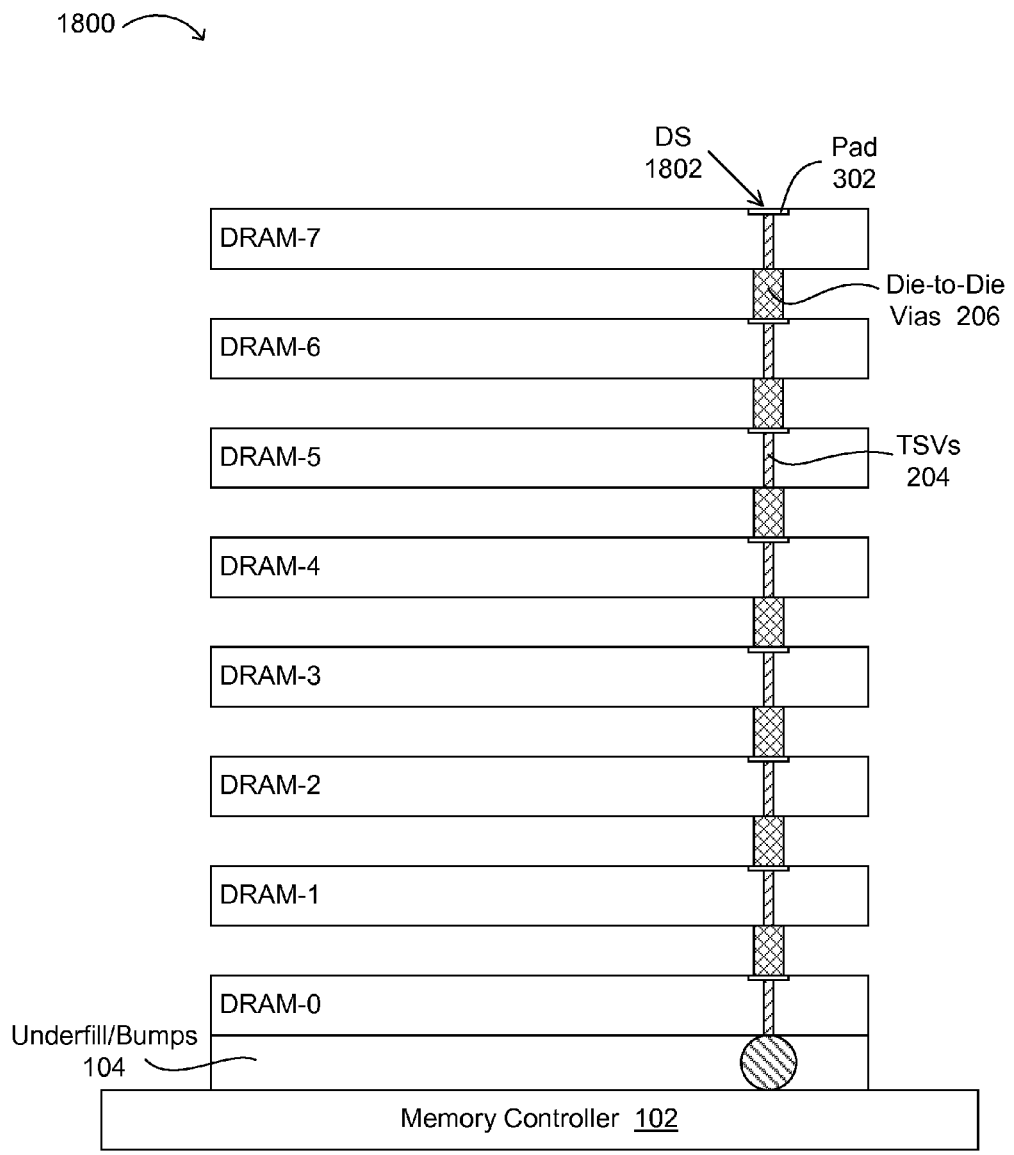
FIG. 18 is a cross-section diagram showing an example shared data strobe signal across stacked DRAMs.

Referring now to FIG. 18, shown is a cross-section diagram 1800 of an example shared data strobe signal across stacked DRAMs. In one example approach for automatic latency adjustment, a data strobe signal (e.g., DS 1802) may be utilized to effectively synchronize data signals based on a designated memory device in the stack, according to SPID. Each appropriate data signal for subsequent DRAMs down the stack of memory devices may adjust a signal phase to match that of the DS signal as driven by a designated (e.g., DRAM-7) device. In this way, each memory device in the stack of memory devices may be synchronized to a DS signal from a predetermined one of the memory devices. In addition, directional control can also be employed whereby the DS signal from one memory device (e.g., DRAM-7 on top of the stack) is used for a read or downstream signaling, and a DS signal from a different memory device (e.g., DRAM-0 at the bottom of the stack) is used for a right or upstream signaling event.

Figure 19:
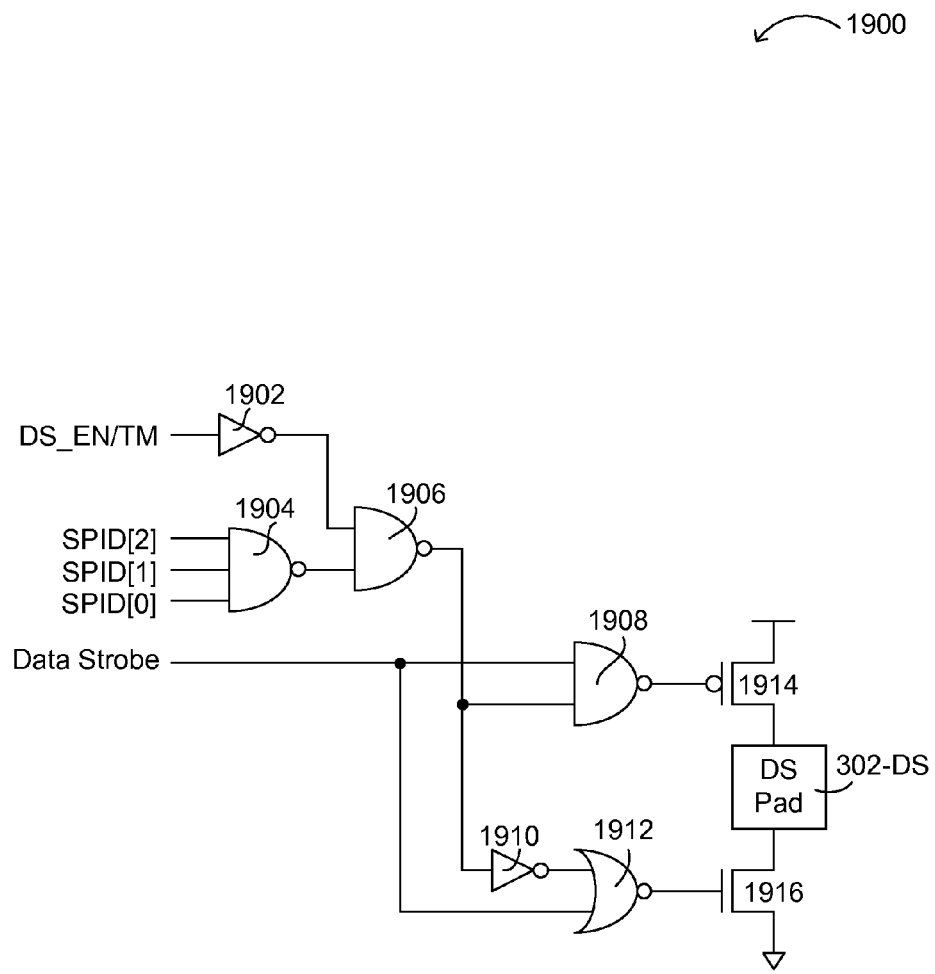
FIG. 19 is a block schematic diagram showing an example data strobe pad driver based on a top of stack SPID.

Referring now to FIG. 19, shown is a block schematic diagram 1900 of an example data strobe pad driver based on a top of stack SPID. In this example, DS pad 302-DS may correspond to pad 302 for DS signal 1802 in FIG. 18. Thus, pad 302-DS may represent the external pad or common vertical connection. Of course, as discussed above, any suitable pad, TSV, die-to-die via, and signal routing arrangement can be accommodated in certain embodiments. In this example, an internal data strobe signal, which might otherwise be driven onto DS pad 302-DS (e.g., in a non-stacked device usage), can be controlled in certain embodiments such that only a predetermined memory device in the stack is allowed to drive pad 302-DS.

In this particular example, a top memory device and a stack of memory devices may be designated to drive pad 302-DS, and in particular for read or downstream operations. Here, if each of bits in SPID[2:0] are high, an output of NAND gate 1904 may be low. This can indicate a top device (e.g., DRAM-7 with SPID=111) is allowed to drive pad 302-DS because NAND gate 1908 may be enabled by a high input thereto, and NOR gate 1912 may be enabled via a low input thereto by way of inverter 1910. Then, if the data strobe input is high, an output of NAND gate 1908 may be low to drive pad 302-DS high via pull-up PMOS transistor 1914. If in this case the data strobe input is low, an output of NOR gate 1912 may be high to drive pad 302-DS low via pull-down NMOS transistor 1916.

Driving capability for a given memory device on pad 302-DS may also be enabled when a DS enable (e.g., for a non-stacked device configuration) or test mode signal is activated such that inverter 1902 presents a low at an input to NAND gate 1906. In this way, a test mode or other DS enable control may be utilized to allow any device, or a particular separately designated memory device and the stack, to drive pad 302-DS. For other memory devices that do not match SPID[2:0]=111, such as any of DRAM-0, DRAM-1, ... DRAM-6, circuit 1900 maybe be used to tri-state pad 302-DS such that the present memory device may not drive this common vertical connection. In this case, NAND gate 1906 may output a low that turns off pull-up transistor 1914 via NAND gate 1908, and pull-down transistor 1916 via NOR gate 1912. In this way, only a predetermined one (e.g., a top memory device in the stack) memory device may drive the common connection data strobe signal (e.g., via pad 302-DS) for a given operation (e.g., a read operation). Of course, one skilled in the art will recognize that other types of circuits, as well as other predetermined SPID bit inputs can also be employed in certain embodiments.

Figure 20:
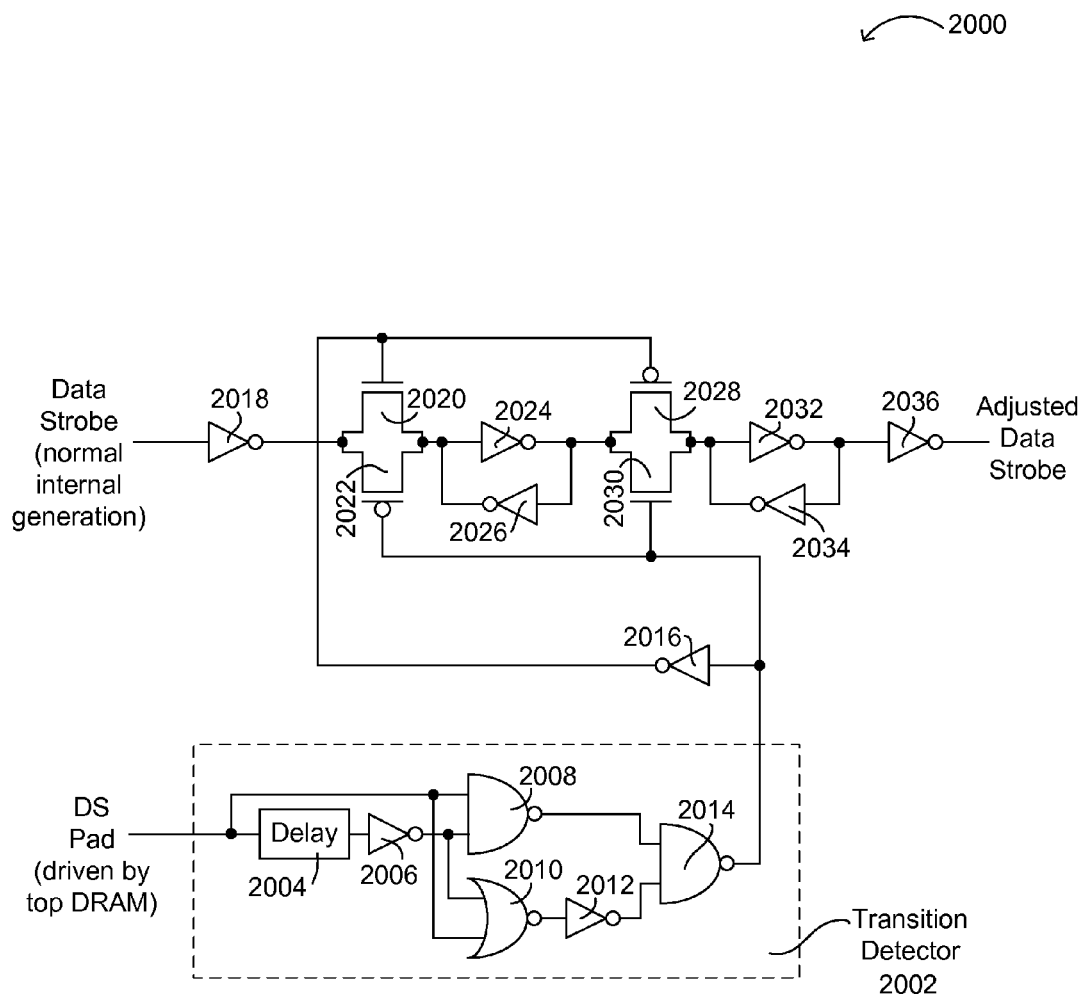
FIG. 20 is a block schematic diagram showing an example data strobe adjustment based on a data strobe driven by the DRAM on the top of the stack of DRAMs.

Referring now to FIG. 20, shown is a block schematic diagram 2000 of an example data strobe adjustment based on a data strobe driven by, e.g., the DRAM on the top of the stack of DRAMs. Transition detector 2002 can be used to detect a transition on a common vertical DS connection (e.g., at pad 302-DS). For example, the common vertical DS connection may be driven by a top memory device in the stack, such as by using the driver enable circuitry as discussed above with reference to FIG. 19. In other cases, the common vertical DS connection may be driven by a bottom memory device in the stack, or by another predetermined memory device in the stack.

Transition detector 2002 may generate a pulse in response to a transition on the common vertical DS signal (labeled "DS pad" in FIG. 20). A low to high transition on the DS pad may be detected by the circuit of NAND gate 2008, delay 2004, and inverter 2006, which can produce a low going pulse (having a duration of about delay 2004) at an output of NAND gate 2008. A high to low transition on the DS pad may be detected by the circuit of NOR gate 2010, delay 2004, and inverter 2006, which can produce a high going pulse of a duration of delay 2004 at an output of NOR gate 2010. The output of NOR gate 2010 can be inverted at 2012, and supplied as one input to NAND gate 2014. Thus, the output of NAND gate 2014 may be a high going pulse generated in response to a transition (either from high to low, or from low to high) on DS pad.

An internally generated data strobe signal can be received at inverter 2018, and supplied to a flip-flop circuit. This internally generated data strobe signal may be a normal such data strobe signal as would be generated if the memory device were configured for non-stacked usage. The flip-flop circuit can include a first pass gate formed by NMOS transistor 2020 and PMOS transistor 2022, a first latch formed by inverters 2024 and 2026, a second pass gate formed by PMOS transistor 2028 and NMOS transistor 2030, and a second latch formed by inverters 2032 and 2034. Transistors 2022 and 2030 may be controlled by the output of NAND gate 2014, and transistors 2020 and 2028 may be controlled by an inverted output of NAND gate 2014 by way of inverter 2016.

In operation, the internally generated data strobe signal can be stored in the first latch when an output of NAND gate 2014 is low. This value from the first latch may be transferred to the second latch when the output of NAND gate 2014 is high, such as during the pulse indicating detection of a transition on the DS pad. The output of the second latch may then be inverted at 2036 and provided as an adjusted data strobe signal. In this way, an internally generated data strobe signal can be adjusted to align with a DS pad signal that is driven by another memory device (e.g., a memory device at the top of a stack of memory devices). For example, this adjusted data strobe may then be used to clock data out in a read operation (e.g., at DQ connections) such that data from each memory device in the stack essentially arrives at a memory controller or common interface chip at substantially a same time.

In this fashion, a data strobe signal on a common vertical connection may be used to align signal timing from multiple memory devices at a common device. The same, or a different, common vertical connection may be utilized in a write path whereby the signal is driven from memory controller 102. In this case, a bottom memory device (e.g., DRAM-0), or simply the memory controller or logic chip itself, may drive the DS signal in an upstream signal flow. Then, each memory device of the stack of memory devices may synchronize write data to the DS signal in the same fashion. In this way, both reads and writes may be effectively synchronized among multiple memory devices using a common vertical signal. Further, any such common vertical signal, or any signal even common to two adjacent devices in a stack, may be used in the same fashion to synchronize from one device to another.

In particular embodiments, serially connected signal interconnects among stacked memory devices may also be accommodated by control of the signal paths at each memory device in the stack. In one embodiment, a semiconductor memory device can include: (i) a stack position identifier for identifying a position of the semiconductor memory device in an aligned vertical stack of a plurality of semiconductor memory devices; (ii) a first pad coupled to a first signal and a first TSV; (iii) a second pad coupled to a second signal and a second TSV; and (iv) a pad signal path determiner configured to couple a signal path from the first pad to the second pad in response to a first state of the stack position identifier, and to couple a signal path from the second pad to the first pad in response to a second state of the stack position identifier.

Figure 21:
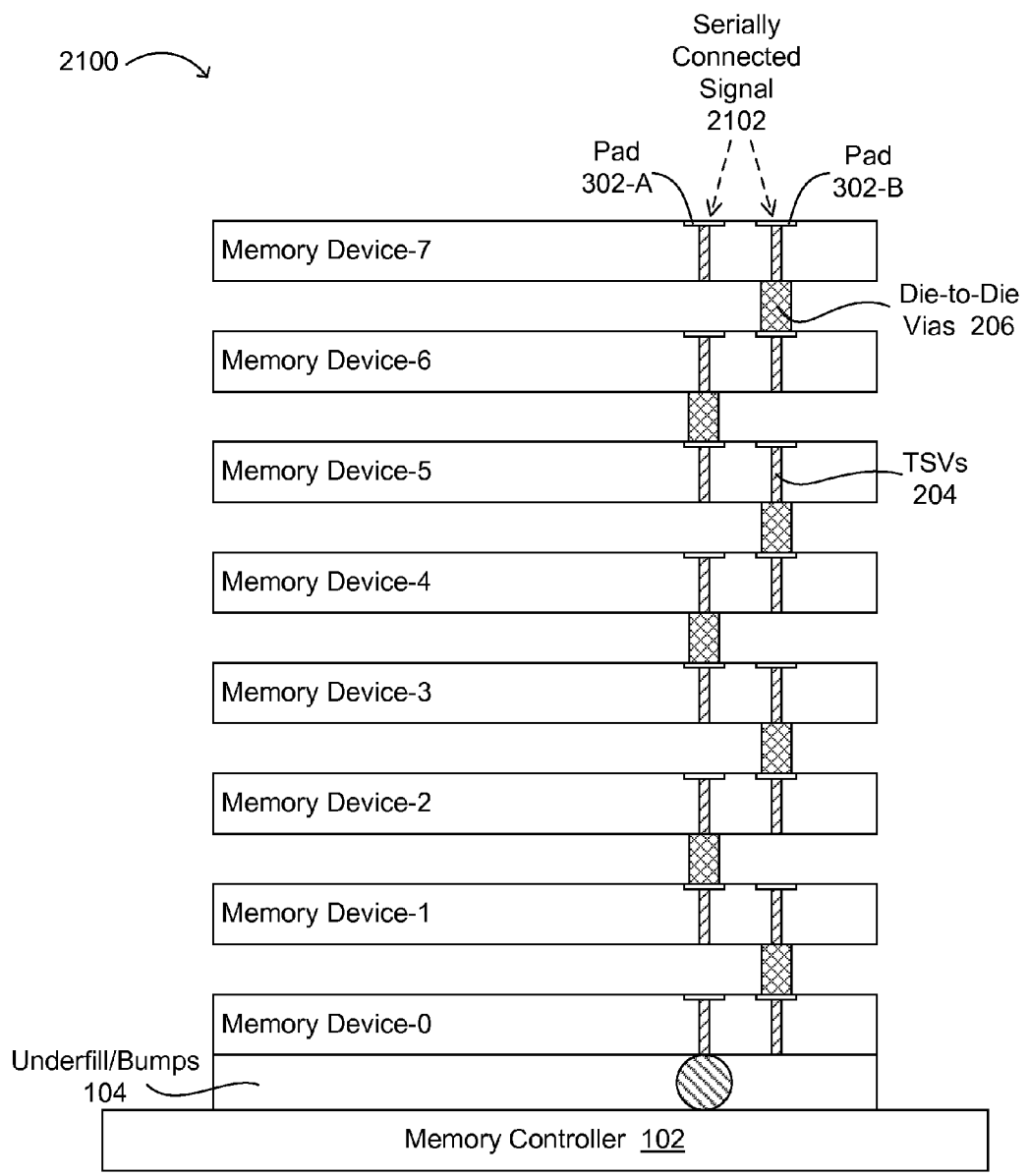
FIG. 21 is a cross-section diagram showing an example serially connected signal through TSVs.

Referring now to FIG. 21, shown is a cross-section diagram 2100 of an example serially connected signal through TSVs. A serially connected signal as described herein may be one that connects from one memory device to another memory device (e.g., adjacent stacked memory devices) in a serial fashion. As shown in the example of FIG. 21, serially connected signal 2102 may include a configuration of pads 302-A and 302-B, along with TSVs 204 and/or die-to-die vias 206. In this way, each memory device may contain two TSVs allocated to a given signal, but the serialization may be provided by way of die-to-die vias. On-chip steering circuitry may be used to control driving of a signal to an adjacent upstream device and/or an adjacent downstream device. In certain embodiments, SPIDs may be used to control such serially connected signal driving.

Serially connected signals as described herein can be any types of signals, such as control and/or data signals, that may interface with a memory device. For example, data I/O signals can be serially connected, such as in a master-slave data arrangement. In another example, each or substantially all data and/or control signals can be serially connected between the memory devices so as to avoid long TSV and/or die-to-die via connections across several devices. In this way, clocking and control can be passed from one memory device to another in serial fashion. Further, pads as described herein can represent any suitable interconnect positions or interfaces on a semiconductor device.

Figure 22:
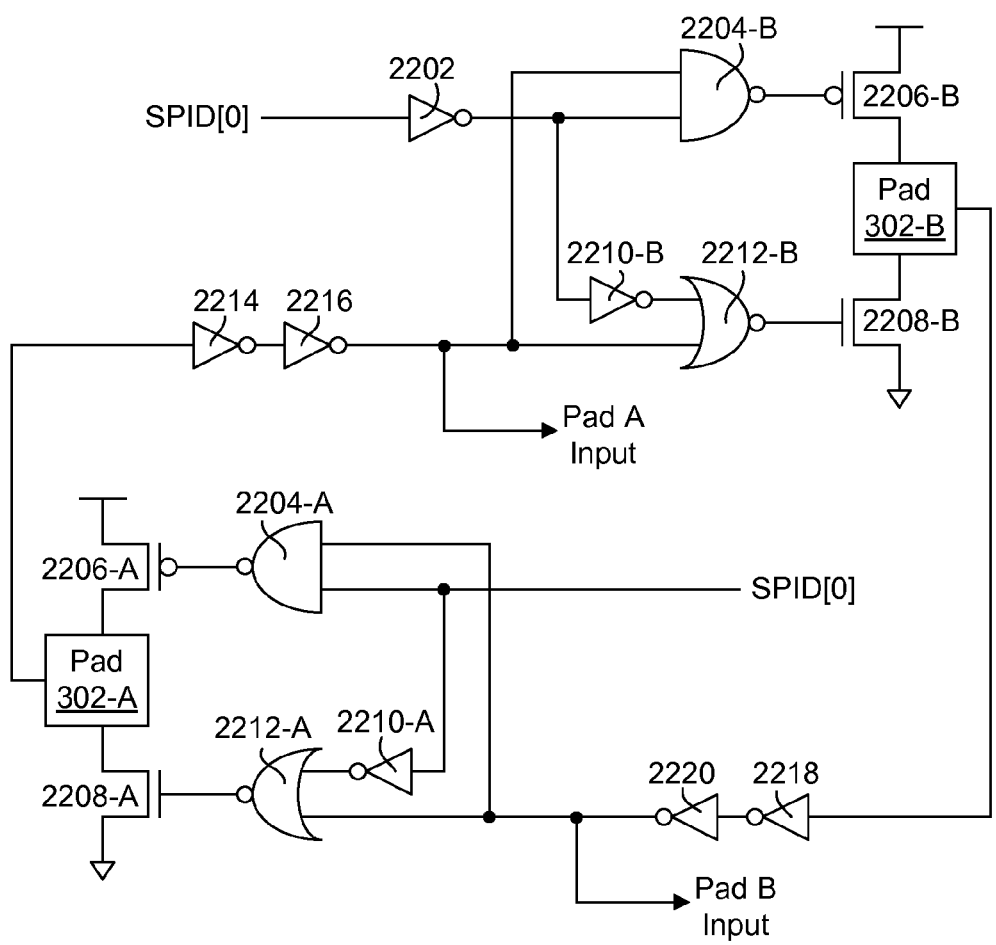
FIG. 22 is a schematic diagram showing example pad drivers for a serially connected signal through TSVs.

Referring now to FIG. 22, shown is a schematic diagram 2200 of example pad drivers for a serially connected signal through TSVs. This example may be applicable for upstream signals; that is, signals flowing from memory controller 102 upstream through each memory device until reaching a top memory device in the stack. Viewed in conjunction with the example of FIG. 21, the example of FIG. 22 shows on-chip control for receiving a signal at one pad (or interconnect position), and directing that signal to another pad (or interconnect position), where the direction of the signal path is alterable depending on SPID values. More specifically, for an even-numbered memory device in the stack of memory devices, SPID[0] may be '0', which may enable an output driver for pad 302-B and disable an output driver for pad 302-A. Similarly, for an odd-numbered memory device in the stack a memory devices, SPID[0] may be '1', which may enable an output driver for pad 302-A, and disable an output driver for pad 302-B. Further, receivers for each pad may be activated regardless of SPID or even/odd values.

In the example of FIG. 22, the tri-statable driver for pad 302-A can include pull-up PMOS transistor 2206-A, pull-down NMOS transistor 2208-A, NAND gate 2204-A, NOR gate 2212-A, and inverter 2210-A. The receiver path from pad 302-B can include inverters 2218 and 2220. Inverter 2218 may represent any suitable type of receiver circuit for receiving a signal from pad 302-B, and converting to full CMOS levels (e.g., including inverter 2220, and labeled pad B input). Similarly, the tri-statable driver for pad 302-B can include pull-up PMOS transistor 2206-B, pull-down NMOS transistor 2208-B, NAND gate 2204-B, NOR gate 2212-B, and inverter 2210-B. The receiver path from pad 302-A can include inverters 2214 and 2216. Inverter 2214 may represent any suitable type of receiver circuit for receiving a signal from pad 302-A, and converting to full CMOS levels (e.g., including inverter 2216, and labeled pad A input).

In certain embodiments, a state of SPID[0], which may indicate an even or odd numbered memory device position in the stack, can be used to determine a direction of the signal path. For example, an even-numbered memory device may receive a signal from pad 302-A and send the signal to pad 302-B, while an odd-numbered memory device may receive a signal from pad 302-B and send the signal to pad 302-A. A true value of SPID[0] can be used to enable the tri-statable driver for pad 302-A, while a compliment of value of SPID[0] can be used (e.g., via inverter 2202) to enable the tri-statable driver for pad 302-B.

Thus, SPID values (e.g., a state of SPID[0]) can be used to effectively steer a signal from one pad to another, particularly when that signal is part of a serially connected path, such as that shown in FIG. 21. Of course, other signal paths, arrangements, components of a signal path (e.g., other than pads, die-to-die vias, etc.) may be included in particular embodiments. Also, other serial connections, such as from one memory device to another memory device that is not adjacent thereto, may also be accommodated in particular embodiments. Further, other circuitry between or around pads or other external connection interfaces (e.g., ESD circuitry) may also be used in certain embodiments.

Figure 23:
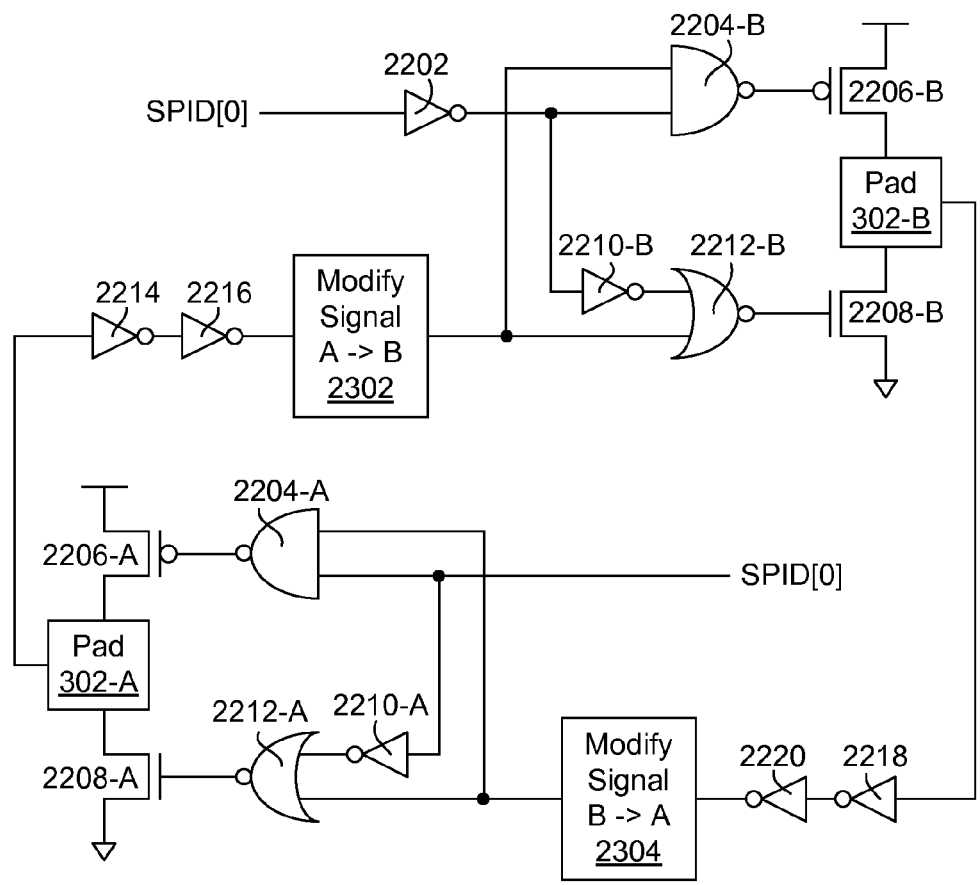
FIG. 23 is a schematic diagram showing example pad drivers for a serially connected signal through TSVs with on-chip signal modifications.

Referring now to FIG. 23, shown is a schematic diagram 2300 of example pad drivers for a serially connected signal through TSV s with on-chip signal modifications. In this example, a pad A input signal at the output of inverter 2216 may be modified 2302 prior to being sent to the tri-statable buffer for pad 302-B. Similarly, a pad B input signal at the output of inverter 2220 may be modified 2304 prior to being sent to the tri-statable buffer for pad 302-A. Such modifications can include any logical or logic circuit or control modifications to the signal. For example, some signals may be gated by other control signals prior to being passed to a next memory device along the serially connected path (e.g., serially connected signal 2102). As another example, master-slave control (e.g., of a data or DQ signal for one device relative to an adjacent device in the stack) can also be implemented in modification blocks 2302/2304.

As one example use of signal modifiers (e.g., via 2302 or 2304), phase differences can be determined between signals propagating via one or more memory devices in the stack. Then, latency may be added where appropriate in order to adjust and synchronize signaling across memory devices. In another example, a clock frequency may be set during test, with counting of clocks based on SPID values, and may be used to determine a latency difference between memory devices (e.g., adjacent devices) in a memory stack. The signal modifiers may also be used to provide results of a capacitance comparison test, such as discussed above with reference to FIGS. 7 and 8, for a pair of pads (e.g., pads A & B, or other pads, etc.).

Test modes may also make use of, or otherwise be incorporated with, signal modifiers (e.g., via 2302 and/or 2304), such as for boundary scan or other design for test (DPT) applications. The signal modifiers can employ any number of logical combinations, test registers, and the like. For example, test registers may be read out from one of pad A or pad B, and passed to the other as part of a test mode. Oscillation modes may also be created in this fashion by using the signal modifiers to invert each signal as it passes through a given memory device. In this way, clocking can occur across multiple memory devices in a stack of memory devices. For example, the serially connected signal may enter a chip with a high value, and send a low value to an adjacent chip, which then send a high value to its adjacent chip, and so on, thus creating a cross chip clock. Also, one serially connected signal path may be designated or used as such a cross chip clock signal for an upstream path, while another such serially connected signal path may be designated or used as a cross-chip for a downstream path. A cross-chip clocking loop may also be formed by connecting the upstream cross-chip clock path to the downstream cross-chip clock path at a designated memory device (e.g., a top memory device in the stack). Such cross-chip clocking may be particularly useful for test modes that test across different memory devices, including those that test memory devices in a stack.

Figure 24:
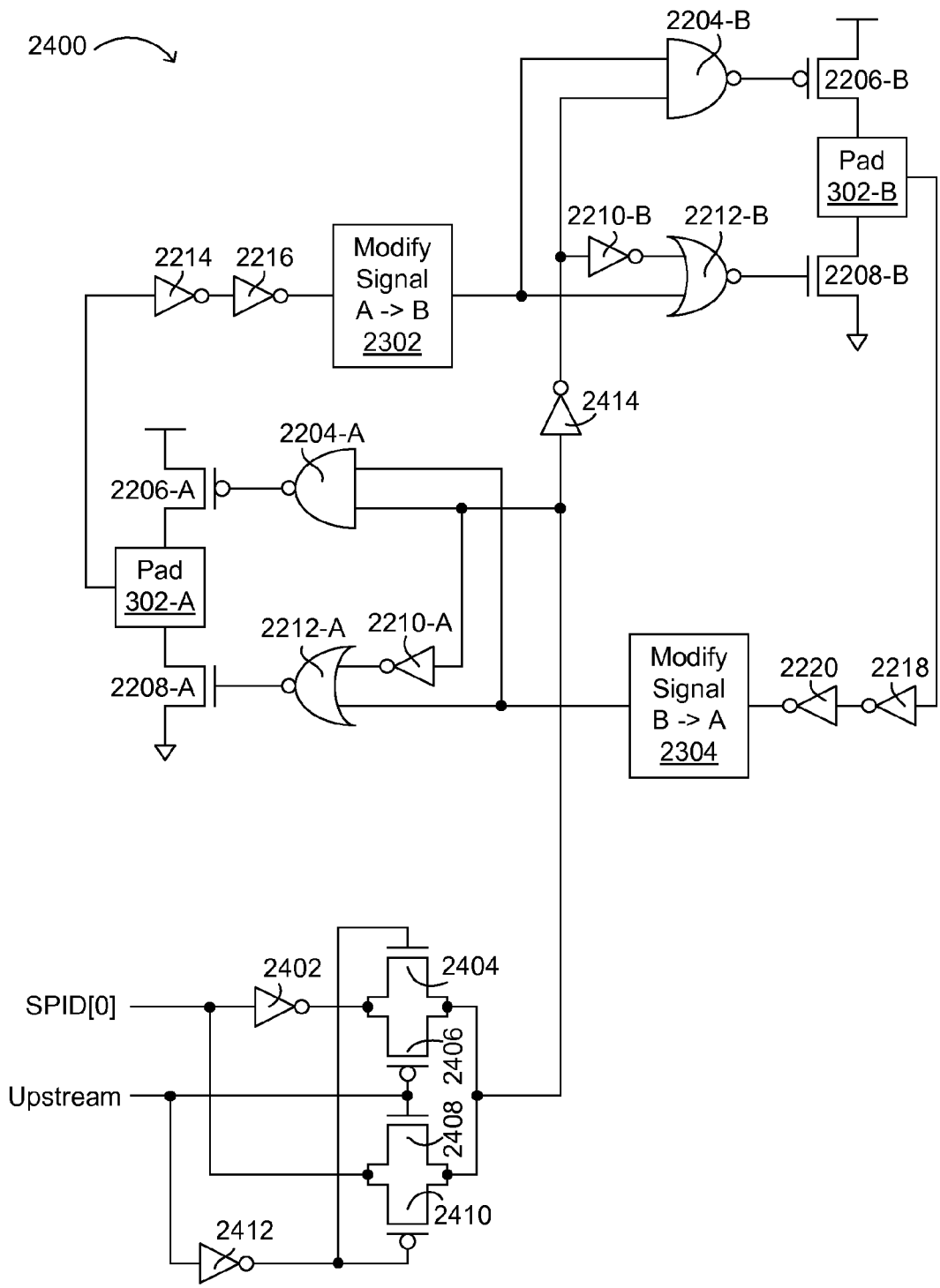
FIG. 24 is a schematic diagram showing example bi-directional pad drivers based on upstream or downstream signaling for a serially connected signal through TSVs.

Referring now to FIG. 24, shown is a schematic diagram 2400 of example bidirectional pad drivers based on upstream or downstream signaling for a serially connected signal through TSVs. In this example, the driver directional control may be changed based on whether the signaling is upstream or downstream for this particular serially connected signal path. If the serially connected signal (e.g., 2102) is for an upstream signal path, the pass gate formed by NMOS transistor 2408 and PMOS transistor 2410 may be turned on by the upstream indicator signal, and its complement via inverter 2412. The upstream indicator being activated can allow for SPID[0] to control the tri-statable driver for pad 302-A, and the compliment of SPID[0] (via inverter 2414) to control the tri-statable driver for pad 302-B. Thus, when the upstream indicator is active, the circuit of FIG. 24 may operate substantially as that of the example in FIG. 23.

However, if the serially connected signal (e.g., 2102) is for a downstream signal path, the pass gate formed by NMOS transistor 2404 and PMOS transistor 2406 may be turned on by the upstream indicator signal being low. The upstream indicator being low can allow for the compliment of SPID[0] (e.g., via inverter 2402) to control the tri-statable driver for pad 302-A, and the true value of SPID[0] (via inverter 2414) to control the tri-statable driver for pad 302-B. Thus, when the upstream indicator is inactive or low, indicating that the signal associated with the serially connected signal path is a downstream signal, even-numbered memory devices may send the signal from pad B to pad A, while odd-numbered memory devices may send the signal from pad A to pad B.

In this way, serially connected signal paths that employ TSVs and two possible external connection positions or pads on each memory device, may be configured to flow through a given device in a direction that is controlled by SPID bits. Of course, depending on the particular patterns of TSVs and/or die-to-die vias, other bits of SPID values could be employed. For example, a signal may be in a common vertical connection position for a bottom half of the memory devices, and can switch over to another common vertical connection position for a top half of the memory devices, or any combination thereof. Based on the particular pattern and type of signaling (e.g., upstream, downstream, modifiable, etc.), different SPID bit values can be used to control the directional flow of the signal through a given memory device.

In particular embodiments, a content-addressable memory (CAM) device may be configured for serial searching in a stacked arrangement. In one embodiment, a method of controlling a search in a first CAM device can include: (i) receiving a search key and a search control signal from a second CAM device, where the second CAM device is a next CAM device below the first CAM device in an aligned vertical stack of a plurality of CAMs devices; (ii) performing a search of the first CAM device in response to the received search key and the received search control signal; (iii) sending the search key and the search control signal from the first CAM device to a third CAM device if the search of the first CAM device results in no match on the first CAM device, where the third CAM device is a next CAM device above the first CAM device in the aligned vertical stack of the plurality of CAMs devices; and (iv) sending a search result to the second CAM device if the search of the first CAM device results in a match on the first CAM device.

Figure 25:
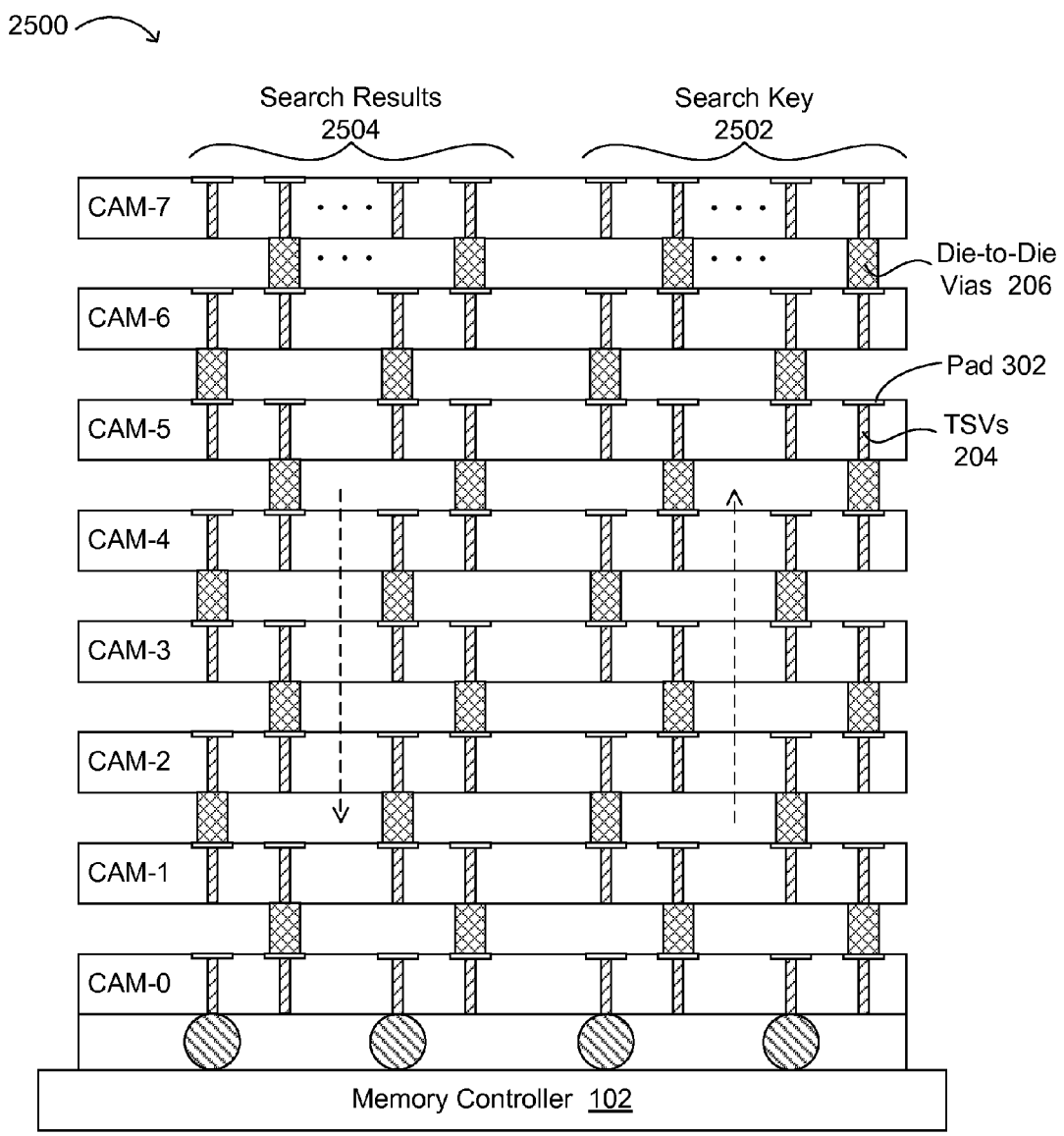
FIG. 25 is a cross-section diagram showing example CAM devices with serially connected search key and search result signals.

Referring now to FIG. 25, shown is a cross-section diagram 2500 of example CAM devices with serially connected search key and search result signals. In this particular example, eight CAM devices are shown, and each may utilize stack position identifiers as discussed herein. As discussed, any type of memory device or repeated chip in a stack of such devices can be accommodated in particular embodiments. Also, any number of such stacked memory devices may also be accommodated, with an associated adjustment in SPID bits. In the particular example of FIG. 25, a search key 2502 can include upstream type serially connected signals. For example, search key 2502 can include upstream serially connected signals such that each CAM device may pass the search key up to a next CAM device when that next CAM device is to perform a search.

In order to save power, if a search of a given CAM results in a match condition, that CAM can send the search results downstream via serially connected signals 2504. Thus, if a search key is presented to CAM-0, and a search is performed on CAM-0 that results in no matches, CAM-0 can then forward the search key upstream to CAM-1 so that CAM-1 can perform a search. This can continue until a particular CAM obtains a match and search result from the search using the search key. The CAM with the match can then send the search results downstream, without notifying any further upstream CAM devices. This has the advantage of saving power by not having to search each CAM device in a stack of such CAM devices. In addition, a priority based on stack position is also provided because of the order of performing searches. For example, CAM-0 may be a higher priority than CAM-1, and CAM-1 may be a higher priority than CAM-2, and so on up the stack of CAM devices.

Figure 26:
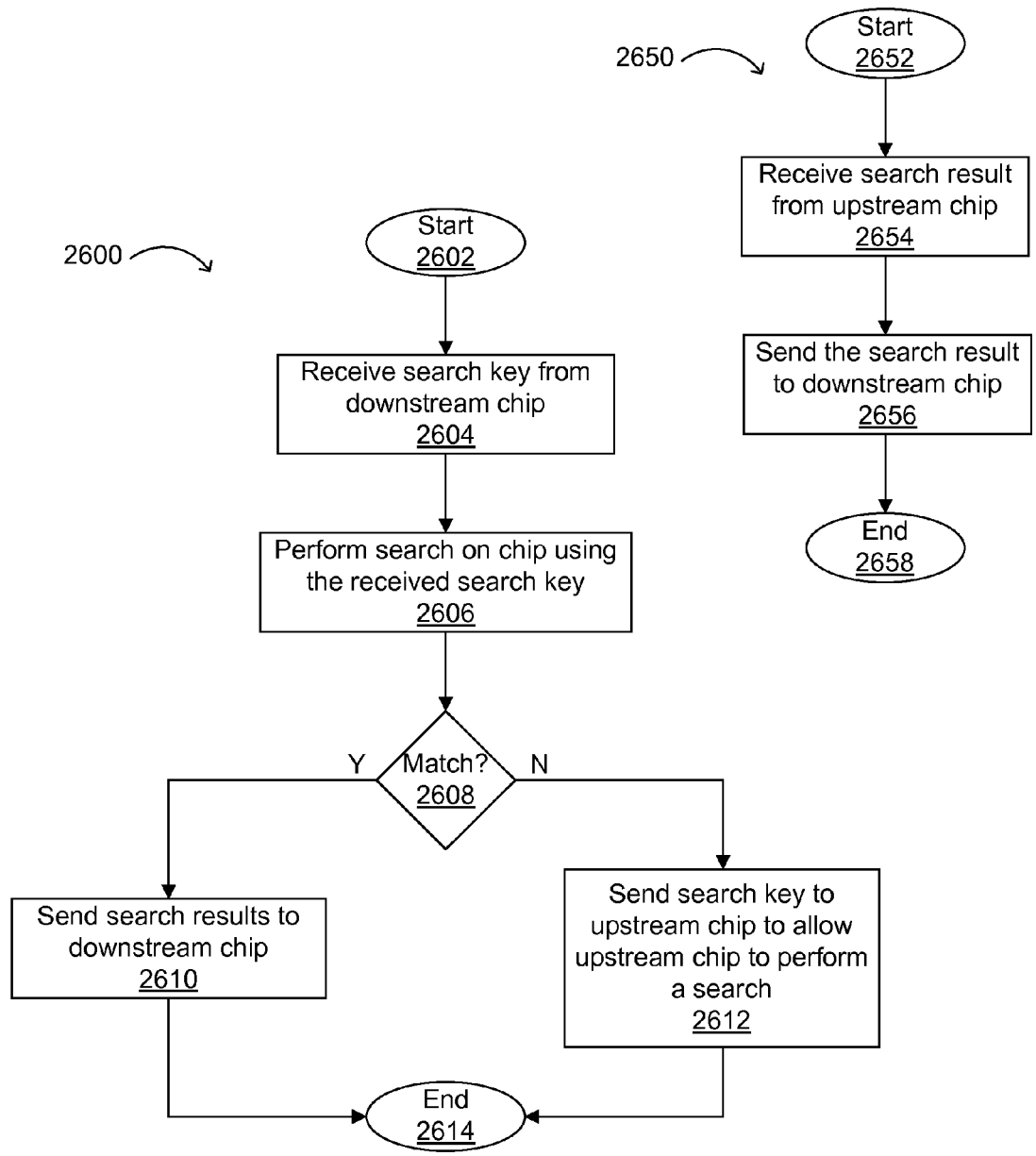
FIG. 26 is a flow diagram showing an example method of performing searches and providing results for stacked CAM devices.

Referring now to FIG. 26, shown is a flow diagram of an example method of performing searches and providing results for stacked CAM devices. In 2600, an example flow for a CAM device that is to perform a search is shown. The flow begins (2602), and at 2604 a search key can be received from a downstream chip. At 2606, a search can be performed using the received search key. If there is a match (2608), at 2610 the search results can be sent to a downstream chip, completing the flow at 2614. However, if there is not a match (2608), at 2612 the search key may be sent upstream (e.g., search key 2502) to allow that upstream chip to allow that upstream chip to perform a search, completing the flow at 2614.

In 2650, an example flow for a CAM device that has already performed a search on a given search key, and resulted in no match, as shown. The flow begins (2652), and at 2654 a search result is received from an upstream chip. Because the given CAM device has already been searched using the given search key, thus the search key may be passed downstream on a serially connected signal path (e.g., search results 2504). Thus at 2656, the search result may be sent to a downstream chip, completing the flow at 2658.

Other CAM functions that can be performed in a sequential fashion by using serially connected signals as described herein, may also be supported in particular embodiments. For example, reads and writes of values to the CAMs may be performed in a sequential fashion, particularly when considering pipelining or interleaving various types of operations, such as reads/writes mixed in with search operations. In one example, in order to maintain timing consistency, search operations may be passed through to each device up the stack and returned from a top device in the stack. For example, even if a search of CAM-3 results in a match to the search key, the search key may still propagate up the stack of CAM devices to reach CAM-7, but with a flag set that indicates that no actual search is to be performed on CAM-4, CAM-5, CAM-6, or CAM-7. For example, such a flag may be applied on another common vertical connection (e.g., a command signal), or may be encoded within search key 2502.

Alternatively, a count of clock cycles may be made in the CAM device having a match of the search key (e.g., CAM-3), and search results 2504 can be driven by CAM-3 at an appropriate time or clock cycle consistent with the search result being driven by the top CAM in the stack (e.g., CAM-7). In either the clock cycle delay, or the actual propagation up to a top CAM and back, additional CAM device searches (e.g., those CAMs above CAM-3 in the stack) may still be suppressed in order to save power. Also, strobe signals can also be employed as discussed above in order to synchronize results from one camp to another CAM. Thus, a consistent number of clock cycles may be designated to a search function no matter which CAM in the stack provides the search result. While this increases a latency of a search result for each search except those that only find a match in the top CAM in the stack, a consistent latency can allow for deeper pipelining of CAM operations.

In another example of search functionality for stacked CAM devices, a search key may be applied to each of the CAM devices in parallel. Then, each CAM in the stack may hold this search key until receiving notice from a CAM position below that CAM in the stack of CAMs. For example, CAM-4 may hold the received search key until receiving an indication from CAM-3 that a search on this search key has resulted in no match, and thus CAM-4 may proceed with a search on that search key. In this approach, fewer signals may be of the serially connected variety, and search key signals may be direct or parallel connected common vertical signals, which may help to reduce CAM chip size.

In another variation, each CAM in the stack of CAMs may hold a supplied search key for possible searching on that CAM for a predetermined number of clock cycles based on the SPID of that CAM device. This predetermined number of clock cycles may include a number of clock cycles that it takes to perform a search operation on a CAM device multiplied by a number representing the stack position via the SPID. For example, if it takes five clock cycles to perform a CAM search, CAM-3 may perform a search of a given search key after 15 clock cycles, upon receiving an indication that none of CAM-0, CAM-1, nor CAM-2 have found a match to the given search key. In this way, CAM operations can be serialized and synchronized for multiple CAM devices in a stack of such devices.

In addition to stacks of memory devices that include a single type of memory device, hybrid structures that include at least two different types of memory devices are also contemplated. For example, one or more SRAMs may be coupled to one or more DRAMs in a stack of such devices. In one example, one or more DRAMs may be stacked on top of one SRAM, and this pattern may be replicated (e.g., one SRAM, followed by three DRAMs, followed by another SRAM, and then another three DRAMs). Such a memory device arrangement may be applicable to cache functionalities and/or applications. Further, SPIDs associated with such hybrid memory device stack structures may include one identifier per repeatable pattern (e.g., one SRAM and three DRAMs), or designated bits (e.g., the two least significant bits) that indicate a specific memory device within a repeatable pattern of memory devices.

As another example hybrid memory device stack structure, a CAM device may be followed by one or more DRAMs devices in a repeatable pattern. With this structure, the DRAMs may be configured to perform CAM operations, or extended search operations, such as when a given CAM does not find a match case. For example, the CAM devices in this repeatable pattern may operate much as discussed above, but a mismatch may first result in a search of associated DRAM devices, prior to being sent to a next CAM device up the stack of memory devices. Further, the DRAMs associated with a given CAM may also be searched in a sequential order. As can be appreciated by one skilled in the art, any suitable variety of memory devices may be stackable, and identifiable via stack position identifiers as discussed herein.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A device, comprising:
   a plurality of comparators, wherein each comparator is configured to compare a first capacitance on a first pad against a second capacitance on a second pad;
   a plurality of latches coupled to outputs of the plurality of comparators, wherein each latch is configured to be set in response to a corresponding comparator output indicating that the first capacitance is greater than the second capacitance; and
   a counter configured to count a number of the plurality of latches that are either:
      set to indicate that the first capacitance is greater than the second capacitance; or not set to indicate that the first capacitance is greater than the second capacitance.

2. The device of claim 1, wherein the number determines a stack position identifier for the device.

3. The device of claim 2, further comprising a register configured to store the stack position identifier on the device.

4. The device of claim 1, wherein the first and second pads are among a plurality of pads allocated to a same signal on the device.

5. The device of claim 1, further comprising a plurality of charge sharing circuits, wherein each charge sharing circuit is coupled to each comparator and configured to couple the first capacitance to the second capacitance when enabled.

6. The device of claim 5, further comprising a plurality of pulse generation circuits, wherein each pulse generation circuit is coupled to each charge sharing circuit and configured to generate an enabling pulse for the charge sharing circuit.

7. The device of claim 6, further comprising:
a first tri-statable driver coupled to the first pad, wherein the first tri-statable driver is configured to pre-charge the first pad to a first state in response to a pre-charge enable signal; and
a second tri-statable driver coupled to the second pad, wherein the second tristatable driver is configured to pre-charge the second pad to a second state in response to the pre-charge enable signal, and wherein the enabling pulse for the charge-sharing circuit is generated in response to a transition of the pre-charge enable signal.

8. The device of claim 7, wherein the first state comprises a low state, and wherein the second state comprises a high state.

9. The device of claim 1, wherein:
the first and second pads are adjacent pads and are among a plurality of pads; and
each of the plurality of pads is coupled to two of the plurality of comparators.

10. The device of claim 9, wherein the first pad comprises a test pad coupled to a predetermined capacitance when the second pad comprises an end pad for the plurality of pads.

11. The device of claim 1, wherein at least one of the first pad or second pad is connected to a through-silicon via (TSV).

12. A method comprising:
comparing, for each of a plurality of pads allocated to a same signal on a semiconductor memory device, a first capacitance on a first pad against a second capacitance on a second pad;
setting a latch if the second capacitance is greater than the first capacitance; and
counting a number of the latches that are either:
set to indicate that the first capacitance is greater than the second capacitance; or
not set to indicate that the first capacitance is greater than the second capacitance.

13. The method of claim 12, further comprising:
determining from the number a stack position identifier of the semiconductor memory device; and
storing the stack position identifier in a register on the semiconductor memory device.

14. The method of claim 12, further comprising charge sharing the first capacitance with the second capacitance.

15. The method of claim 14, further comprising generating a pulse to enable the charge sharing.

16. The method of claim 15, further comprising:
pre-charging the first pad to a first state in response to a pre-charge enable signal;
pre-charging the second pad to a second state in response to the pre-charge enable signal; and
generating the pulse for enabling the charge sharing in response to a transition of the pre-charge enable signal.

17. The method of claim 16, wherein the first state comprises a low state, and wherein the second state comprises a high state.

18. The method of claim 12, wherein the first pad or the second pad is connected to a through-silicon via (TSV).

19. An apparatus having an aligned vertical stack of a plurality of semiconductor memory devices, the apparatus comprising for each semiconductor memory device:
a plurality of comparators, wherein each comparator is configured to compare a first capacitance on a first pad against a second capacitance on a second pad;
a plurality of latches coupled to outputs of the plurality of comparators, wherein each latch is configured to be set in response to a corresponding comparator output indicating that the first capacitance is greater than the second capacitance; and
a counter configured to count a number of the plurality of latches that are either:
set to indicate that the first capacitance is greater than the second capacitance; or
not set to indicate that the first capacitance is greater than the second capacitance.

20. The apparatus of claim 19, wherein the number determines a stack position identifier for the device, and further comprising a register configured to store the stack position identifier on the device.

21. The apparatus of claim 19, wherein the first and second pads are among a plurality of pads allocated to a same signal on the semiconductor memory device.

22. The apparatus of claim 21, wherein the first and second pads are adjacent pads, and wherein each of the plurality of pads is coupled to two of the plurality of comparators.

23. The apparatus of claim 21, wherein a through-silicon via (TSV) is configured to connect a signal between a first of the plurality of semiconductor memory devices and a second of the plurality of semiconductor memory devices in the aligned vertical stack, and wherein the signal is coupled to at least one of the plurality of pads.

24. The apparatus of claim 23, wherein a different of the plurality of pads is connected to a TSV for each of the plurality of semiconductor memory devices.

* * * * *